United States Patent
Khoshkava et al.

(10) Patent No.: US 10,331,216 B1
(45) Date of Patent: Jun. 25, 2019

(54) ELASTOMER SUSPENSION WITH ACTUATION FUNCTIONALITY AND SENSING FUNCTIONALITY

(71) Applicant: Immersion Corporation, San Jose, CA (US)

(72) Inventors: Vahid Khoshkava, Montreal (CA); Juan Manuel Cruz-Hernandez, Montreal (CA); Neil T. Olien, Montreal (CA)

(73) Assignee: IMMERSION CORPORATION, San Jose, CA (US)

( * ) Notice: Subject to any disclaimer, the term of this patent is extended or adjusted under 35 U.S.C. 154(b) by 0 days.

(21) Appl. No.: 15/885,501

(22) Filed: Jan. 31, 2018

(51) Int. Cl.
| | |
|---|---|
| *G06F 3/01* | (2006.01) |
| *H03K 17/975* | (2006.01) |
| *H03K 17/96* | (2006.01) |
| *G06F 3/044* | (2006.01) |

(52) U.S. Cl.
CPC ............. *G06F 3/016* (2013.01); *G06F 3/044* (2013.01); *H03K 17/962* (2013.01); *H03K 17/964* (2013.01); *H03K 17/975* (2013.01); *H03K 2217/96073* (2013.01)

(58) Field of Classification Search
CPC .................... G06F 3/016; G06F 3/044; G06F 2203/04103; G06F 3/0412; G02F 1/13338; H03K 17/975; H03K 17/964; H03K 17/962; H03K 2217/96073
See application file for complete search history.

(56) References Cited

U.S. PATENT DOCUMENTS

| | | |
|---|---|---|
| 2009/0244017 A1 | 10/2009 | Pala et al. |
| 2009/0267892 A1 | 10/2009 | Faubert |
| 2013/0207793 A1 | 8/2013 | Weaber et al. |
| 2013/0257759 A1 | 10/2013 | Daghigh |
| 2017/0052624 A1 | 2/2017 | Hunt et al. |
| 2017/0273599 A1* | 9/2017 | Reese ................. A61B 5/0004 |
| 2017/0316250 A1 | 11/2017 | Roh et al. |

OTHER PUBLICATIONS

Extended European Search Report dated May 7, 2019 in European Application No. 19153497.3.

* cited by examiner

*Primary Examiner* — Abbas I Abdulselam
(74) *Attorney, Agent, or Firm* — Medler Ferro Woodhouse & Mills PLLC

(57) ABSTRACT

A haptic-enabled user interface device comprising a user input component, an elastomer suspension, a signal generating circuit, a signal sensing circuit, one or more switches, and a control unit is presented. The elastomer suspension is formed by at least one stack that includes an elastomeric layer, wherein the at least one stack forms at least one capacitor. The control unit is configured, in an actuation mode, to cause the one or more switches to electrically connect the signal generating circuit to the at least one capacitor and to electrically disconnect the signal sensing circuit from at least one capacitor, and to cause the signal generating circuit to apply a drive signal to the at least one capacitor. The control unit is further configured, in a sensing mode, to cause the one or more switches to electrically connect the signal sensing circuit to the at least one capacitor.

20 Claims, 21 Drawing Sheets

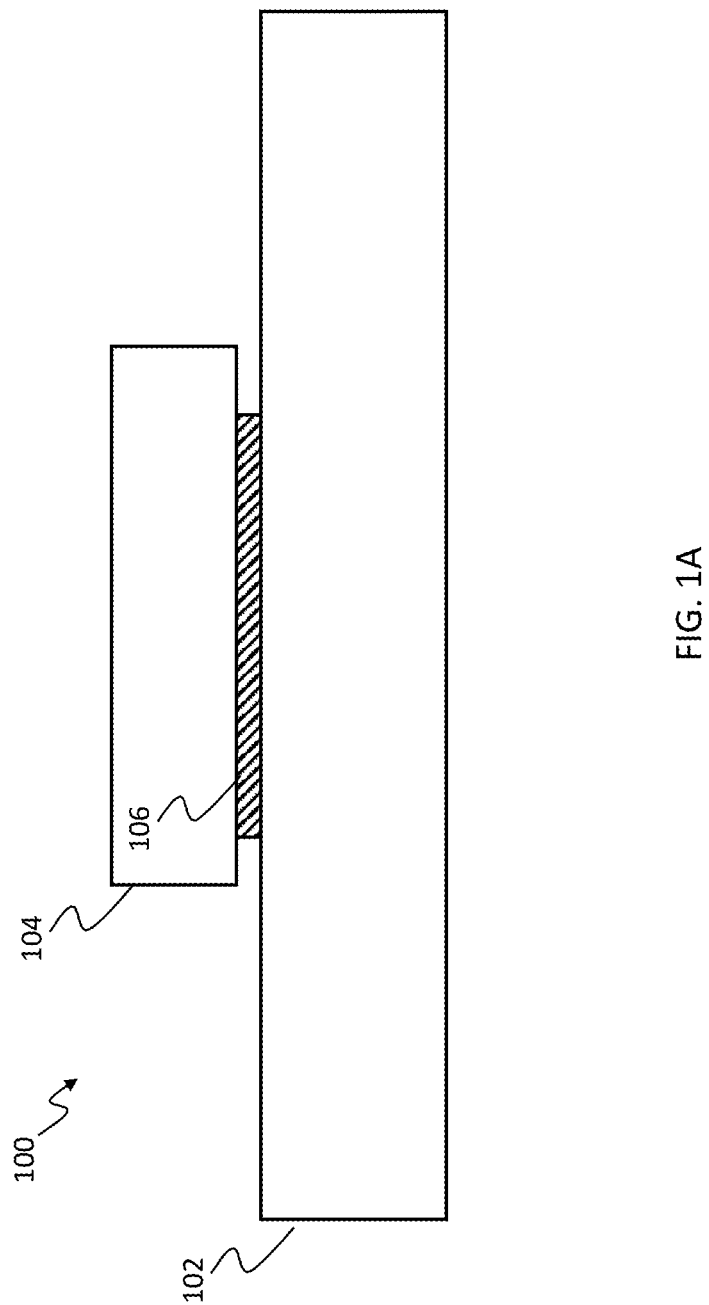

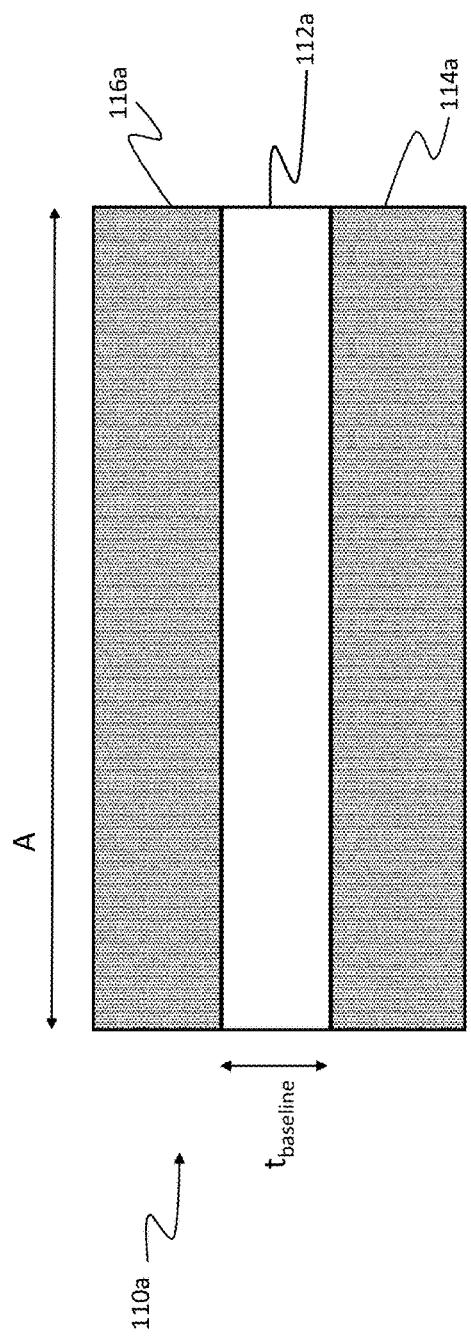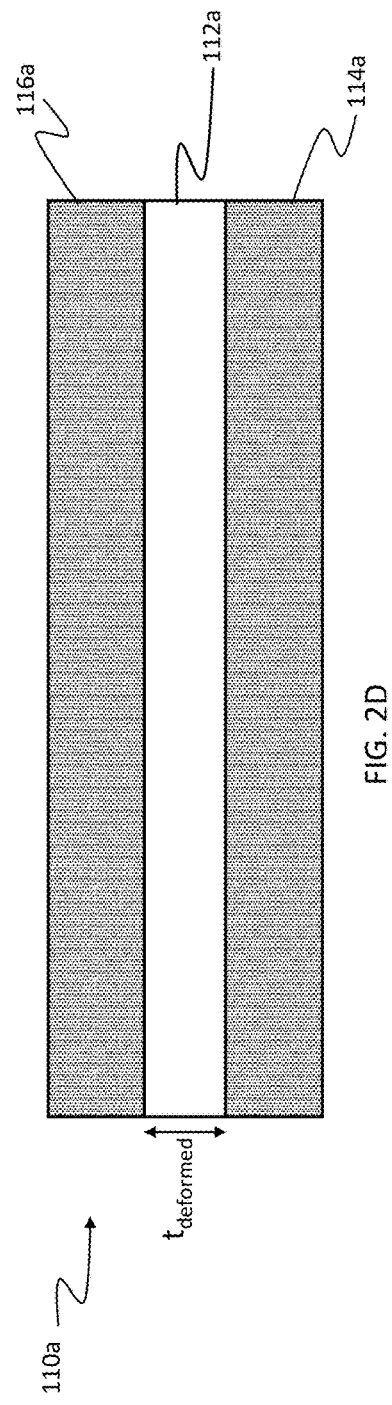
FIG. 2C
FIG. 2D

ELASTOMER SUSPENSION WITH ACTUATION FUNCTIONALITY AND SENSING FUNCTIONALITY

FIELD OF THE INVENTION

The present invention is directed to an elastomer suspension with actuation functionality and sensing functionality.

BACKGROUND

Electronic device manufacturers strive to produce a rich interface for users. Many devices use visual and auditory cues to provide feedback to a user. In some interface devices, a kinesthetic effect (such as active and resistive force feedback) and/or a tactile effect (such as vibration, texture, and heat) are also provided to the user. Kinesthetic effects and tactile effects may more generally be referred to as "haptic feedback" or "haptic effects". Haptic feedback can provide cues that enhance and simplify the user interface. For example, vibrotactile haptic effects may be useful in providing cues to users of electronic devices to alert the user to specific events, or provide realistic feedback to create greater sensory immersion within an actual, simulated or virtual environment. Such systems may have application in a user interfaces, gaming, automotive, consumer electronics and other user interfaces in actual, simulated or virtual environments.

SUMMARY

One aspect of the embodiments herein relate to a haptic-enabled user interface device comprising a user input component, a base for supporting the user input component, an elastomer suspension, a signal generating circuit, a signal sensing circuit, one or more switches, and a control unit. The elastomer suspension is for suspending the user input component on the base, such that the user input component does not directly contact the base. The elastomer suspension is formed by at least one stack that includes an elastomeric layer of an elastomer material and includes a pair of electrodes on opposite sides of the elastomeric layer, wherein the at least one stack forms at least one capacitor. The one or more switches are configured to electrically connect and to disconnect the signal sensing circuit and the signal generating circuit from the at least one capacitor. The control unit is in communication with the signal generating circuit, the signal sensing circuit, and the one or more switches. The control unit is configured, in an actuation mode, to cause the one or more switches to electrically connect the signal generating circuit to the at least one capacitor and to electrically disconnect the signal sensing circuit from at least one capacitor, and to cause the signal generating circuit to apply a first signal as a drive signal to the at least one capacitor, wherein the drive signal causes relative movement of the pair of electrodes toward each other so as to generate a haptic effect. The control unit is further configured, in a sensing mode, to cause the one or more switches to electrically connect the signal sensing circuit to the at least one capacitor, and to determine, based on a second signal sensed by the signal sensing circuit, whether a touch input has been received by the user input component of the haptic-enabled user interface device.

In an embodiment, the control unit is configured, in the sensing mode, to determine whether the touch input has been received by determining, based on the second signal sensed by the signal sensing circuit, whether a capacitance of the at least one capacitor has changed from a defined or measured baseline capacitance by at least a defined threshold.

In an embodiment, the control unit is configured, in the sensing mode, to cause the one or more switches to electrically disconnect the signal generating circuit from the at least one capacitor.

In an embodiment, the control unit is configured, in the actuation mode, to electrically disconnect the signal sensing circuit from both electrodes of the pair of electrodes of the at least one capacitor, and is further configured, in the sensing mode, to electrically disconnect the signal generating circuit from both electrodes of the pair of electrodes of the at least one capacitor.

In an embodiment, the control unit is configured to determine that a pressure-based touch input has been received at the user input component in response to a determination that there is a change in capacitance of the at least one capacitor.

In an embodiment, the control unit is configured to determine that non-contact proximity of an object to the user input component of the haptic-enabled user interface device has been detected in response to detecting the change in capacitance of the at least one capacitor. In the embodiment, the pressure-based touch input is associated with the change in capacitance being in a first defined range relative to a measured or defined baseline capacitance, and the non-contact proximity of an object is associated with the change in capacitance being in a second defined range relative to the measured or defined baseline capacitance.

In an embodiment, the drive signal has an amplitude in a range of 500 V to 10 kV, and a frequency that is in a range of 10 Hz to 500 Hz.

In an embodiment, the elastomer material is a polymer having a durometer that is in a range of shore 00-10 to shore A-50, and wherein each of the pair of electrodes is formed from a stretchable conductive material.

In an embodiment, the elastomer material of the elastomeric layer includes at least one of polyisoprene, isobutylene, isoprene, polybutadiene, styrene-butadiene rubber, ethylene propylene rubber, polyacrylic rubber, or silicone rubber, and wherein the stretchable conductive material includes graphene.

In an embodiment, the user input component is a button.

In an embodiment, the haptic-enabled user interface device is a wearable device.

In an embodiment, the at least one capacitor of the elastomer suspension comprises a plurality of stacks that form a plurality of respective capacitors, and wherein the signal sensing circuit is configured to receive respective signals from the plurality of capacitors, and is configured to determine location-based information for the touch input on a surface of the user input component based on the respective signals.

In an embodiment, the at least one stack has a thickness that is in a range between 0.2 mm and 10 mm.

In an embodiment, the elastomer suspension has a resonance frequency that is less than 500 Hz.

In an embodiment, the elastomer suspension forms a seal between the user input component and the base.

In an embodiment, the elastomer suspension further includes a piezoelectric layer of ceramic piezoelectric material in contact with at least one electrode of the pair of electrodes, and wherein the drive signal causes the piezoelectric layer to vibrate.

One aspect of the embodiments herein relates to a haptic-enabled user interface device, comprising a user input component, a base for supporting the user input component, an elastomer suspension, a signal generating circuit, a signal sensing circuit, one or more switches, and a control unit. The elastomer suspension is for suspending the user input component on the base, such that the user input component does not directly contact the base. The elastomer suspension is formed by at least one stack that includes a piezoelectric layer of piezoelectric material, a pair of electrodes on opposite sides of the piezoelectric material, and an elastomeric layer of elastomer material in contact with at least one of the pair of electrodes. The one or more switches are configured to electrically connect and disconnect the signal sensing circuit and the signal generating circuit from at least a first electrode or a second electrode of the pair of electrodes. The control unit in communication with the signal generating circuit, the signal sensing circuit, and the one or more switches. The control unit is configured, in an actuation mode, to cause the one or more switches to electrically connect the signal generating circuit to at least one of the first electrode or the second electrode, to cause the one or more switches to electrically disconnect the signal sensing circuit from the at least one of the first electrode or the second electrode, and to cause the signal generating circuit to generate a first signal as a drive signal that causes the piezoelectric layer to vibrate. The control unit is further configured, in a sensing mode, to cause the one or more switches to electrically connect the signal sensing circuit to the at least one of the first electrode or the second electrode, and to determine, based on a second signal sensed by the signal sensing circuit, whether a user input has been received by the haptic-enabled user interface device, wherein the second signal is caused by deformation of the piezoelectric layer.

In an embodiment, the control unit is configured, in the actuation mode, to cause the one or more switches to electrically disconnect the signal sensing circuit from both the first electrode and the second electrode, and is configured, in the sensing mode, to electrically disconnect the signal generating circuit from both the first electrode and the second electrode.

In an embodiment, the haptic-enabled user interface device further comprises a third electrode, wherein the elastomeric layer is disposed between the second electrode and the third electrode. In the embodiment, he control unit is configured, in the actuation mode, to cause the one or more switches to electrically connect the signal generating circuit to both the first electrode and the third electrode, and to electrically disconnect the signal sensing circuit from both the first electrode and the third electrode. The control unit is further configured, in the sensing mode, to cause the one or more switches to electrically connect the signal sensing circuit to both the first electrode and the third electrode, and to electrically disconnect the signal generating circuit from both the first electrode and the third electrode. In the embodiment, the second electrode is electrically grounded.

In an embodiment, the ceramic piezoelectric material has a Young's Modulus that is in a range of 100 GPa to 300 GPa, wherein the drive signal has an amplitude in a range of 1 V to 50 V, and the elastomer material is a polymer that has a Young's Modulus that is in a range of 10 MPa to 100 MPa.

BRIEF DESCRIPTION OF THE DRAWINGS

The foregoing and other features and advantages of the invention will be apparent from the following description of embodiments hereof as illustrated in the accompanying drawings. The accompanying drawings, which are incorporated herein and form a part of the specification, further serve to explain the principles of the invention and to enable a person skilled in the pertinent art to make and use the invention. The drawings are not to scale.

FIGS. 1A-1C illustrate a haptic-enabled user interface having an elastomer suspension, according to embodiments hereof.

FIGS. 2A-2D illustrate an elastomer suspension, according to an embodiment hereof.

DETAILED DESCRIPTION

Figure 1B:
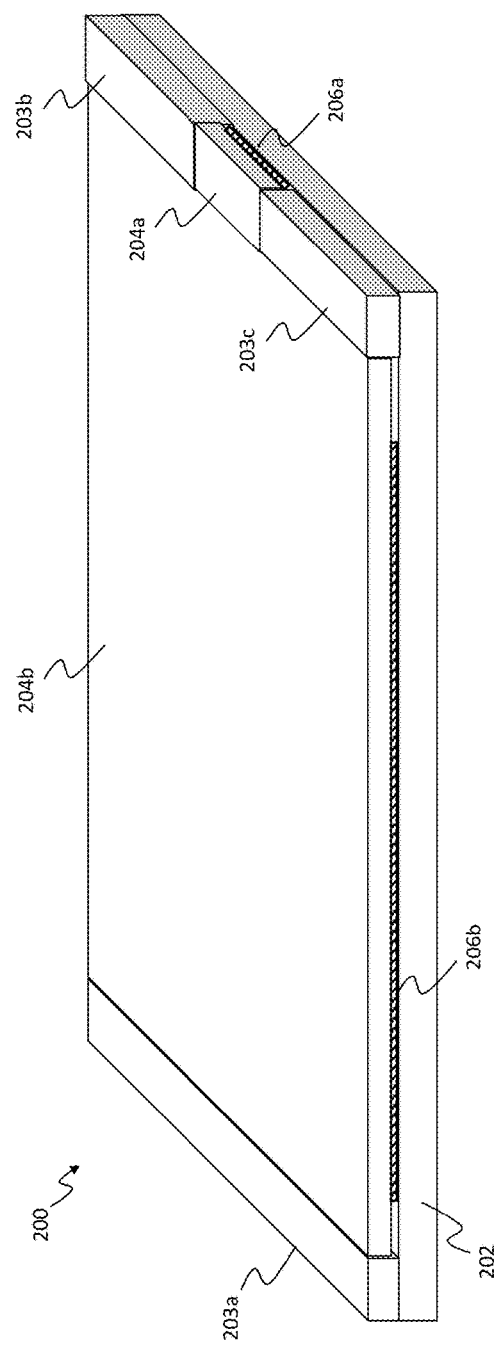

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Embodiments hereof relate to an elastomer suspension that may provide suspension functionality, haptic actuation functionality, and sensing functionality. In an embodiment, the elastomer suspension may be part of a user interface device, such as a mobile phone, laptop, or tablet computer. The suspension functionality may involve suspending a first portion, or more specifically a suspended portion of the user interface device on a second portion, or more specifically a base portion of the user interface device, and isolating the base portion of the user interface device from the suspended portion of the user interface device. The suspension functionality may be provided by an elastomer material that is sufficiently soft to provide the isolation feature. In an embodiment, the first portion of the user interface device that is suspended may be a user input component, such as a touch screen. The softness of the elastomer material may allow the elastomer suspension to deform when a user presses on the user input component. Such a deformation may provide a feeling of a button click or other feeling associated with a mechanical user input device.

In an embodiment, a haptic actuation functionality for an elastomer suspension may be provided by utilizing a dielectric material as the elastomer material thereof and placing the dielectric elastomer material between two electrodes. The dielectric elastomer material and the two electrodes may form a capacitor. When a drive signal is applied to at least one of the two electrodes, a force of attraction may be created between the two electrodes, which may squeeze the elastomer material. The elastomer material may be sufficiently soft to be deformed by the force of attraction between the two electrodes. Thus, the capacitor formed by the elastomer suspension may provide the haptic actuation functionality by converting an electrical input (e.g., the drive signal) to a mechanical output (e.g., relative movement between the two electrodes). For instance, a drive signal may cause the elastomer material to oscillate between being in a deformed state and being in an undeformed state, and to cause the electrodes to oscillate between moving toward each other and returning to their original positions, so as to generate a vibrotactile haptic effect with the elastomer suspension.

In an embodiment, the sensing functionality provided by the elastomer suspension may be used to sense a touch input, such as a user pressing on a user input component. The elastomer material of the elastomer suspension may be sufficiently soft to deform from pressure of such a touch input, which may be referred to as a pressure-based touch input. In an embodiment, the deformation of the elastomer material may generate a signal, in which the elastomer material converts mechanical input from the deformation to an electrical output (e.g., a voltage, current, or other electrical signal). In such an embodiment, the pressure-based touch input may be detected by detecting an electrical signal generated by the elastomer material of the elastomer suspension. In an embodiment, the deformation may cause a capacitance of the capacitor formed by the elastomer suspension to change. In such an embodiment, the pressure-based touch input may be detected by detecting a change in capacitance in the elastomer suspension caused by deformation of the elastomer material. The pressure-based touch input, such as a click of a button or other user input component, may be associated with at least a threshold amount of change in the capacitance of the elastomer suspension on which the user input component is suspended. In an embodiment, a touch input that does not exert sufficient pressure to deform the elastomer material may still change the capacitance of the suspension, but by a smaller degree compared with a pressure-based touch input. In an embodiment, user proximity that does not involve contact with the user input component, which may be referred to as non-contact user proximity to the user input component, may also cause a change in capacitance to the elastomer suspension, but by a smaller degree compared with the pressure-based touch input.

In an embodiment, an elastomer suspension may alternate between being used to provide a haptic actuation functionality and being used to provide a sensing functionality. The haptic actuation functionality may use a signal generating circuit, while the haptic sensing functionality may use a signal sensing circuit. When the elastomer suspension is being used to provide the sensing functionality, one or more switches may electrically connect the elastomer suspension to the signal sensing circuit. More specifically, the one or more switches may electrically connect electrodes in the elastomer suspension to the signal sensing circuit. In some cases, the one or more switches may further electrically disconnect electrodes in the elastomer suspension from the signal generating circuit. When the elastomer suspension is being used to provide the haptic actuation functionality, the one or more switches may electrically connect the signal generating circuit to the electrodes of the elastomer suspension, and electrically disconnect electrodes of the elastomer suspension from the signal sensing circuit. The signal sensing circuit is disconnected so that any strong drive signal that is used for the haptic actuation functionality does not reach the signal sensing circuit and damage the sensing circuit.

In an embodiment, an elastomer suspension may combine a piezoelectric material and an elastomer material. In some cases, the piezoelectric material may be a ceramic piezoelectric material that may provide haptic actuation functionality and/or sensing functionality. Such an embodiment may still rely on the elastomer material for part of the haptic actuation functionality and sensing functionality, or may instead rely on only the ceramic piezoelectric material for such functionality. In some cases, the ceramic piezoelectric material may be able to generate a greater amount of movement relative to movement generated with a capacitor formed by the elastomer material and electrodes alone. The ceramic piezoelectric material alone, however, may be too hard, rigid, or brittle to act as a suspension for a user input component. For instance, the ceramic piezoelectric material may be unable to deform in response to a user pressing on the user input component, and may be unable to isolate a base from the user input component. Thus, the ceramic piezoelectric material may be combined with the elastomer material to form an elastomer suspension that may leverage the ceramic piezoelectric material for providing a haptic actuation functionality and/or sensing functionality, and leverage the elastomer material for providing a suspension functionality.

FIG. 1A illustrates an example of a haptic-enabled user interface device 100 that includes a user input component 104, a base 102 for supporting the user input component 104, and an elastomer suspension 106 for suspending the user input component 104 on the base 102, such that the user input component 104 does not directly touch or otherwise contact the base 102.

In an embodiment, the haptic-enabled user interface device 100 may be a mobile phone, a wearable device, a game controller, a laptop or tablet computer, or any other user interface device. For instance, FIG. 1B depicts an embodiment of a haptic-enabled user interface device 200 that is a mobile phone. More specifically, the haptic-enabled user interface device 200 includes a base 202 that provides a substrate for supporting various components of the haptic-enabled user interface device 200. For instance, the base 202 may support bezel components 203*a*, 203*b*, 203*c* that form part of a housing of the device 200, as well as support a first user input component 204*a* and a second user input component 204*b*. In an embodiment, the base 202 may form at least part of a housing of the haptic-enabled user interface device 200, and may be formed from a material such as metal, plastic, glass, or a combination thereof. In the embodiment of FIG. 1B, the first user input component 204*a* may be a button (e.g., a home button), while the second user input component 204*b* may be a touch screen. The haptic-enabled user interface device 200 includes a first elastomer suspension 206*a* for suspending the first user input component 204*a* on the base 202, and further includes a second elastomer suspension 206*b* for suspending the second user input component 204*b* on the base 202. In an embodiment, the first elastomer suspension 206*a* and the second elastomer suspension 206*b* may provide a feeling of a mechanical click when the respective user input component 204*a*, 204*b* is pressed against the base 202, e.g., in a downward direction. Thus, the first elastomer suspension 206*a* and the second elastomer suspension 206*b* may allow their respective user input components 204*a*, 204*b* to act as a mechanical button that can be clicked.

In an embodiment, the second user input component 204*b*, which is a touch screen, may also include a grid of conductive wires (not shown) used to perform capacitive and/or resistive touch sensing. The grid of conductive wires may be used, for e.g., to detect a location of a touch input or, more specifically, recognize a touch-based input gesture. The grid of conductive wires may be disposed at a first surface, e.g., an upper surface, of the second user input component 204*b*, in order to perform the touch sensing. For instance, the grid of conductive wires may be disposed just beneath the first surface within the second user input component. The elastomer suspension 206*b*, on the other hand, may be disposed at a second, opposite surface, or more specifically a lower surface of the second user input component 204b, in order to act as a suspension between the second user input component 204b and the base 202.

In an embodiment, the haptic-enabled user interface device 200 may include a sealing material that is separate from the first elastomer suspension 206a and the second elastomer suspension 206b, and that forms a seal between the first user input component 204a and the base 202, as well as a seal between the second user input component 204b and the base 202. In another embodiment, as discussed in more detail below, e.g., with respect to FIG. 5A, the first elastomer suspension 206a and/or the second elastomer suspension 206b may themselves provide a seal between their respective user input component 204a, 204b and the base 202.

Figure 1C:
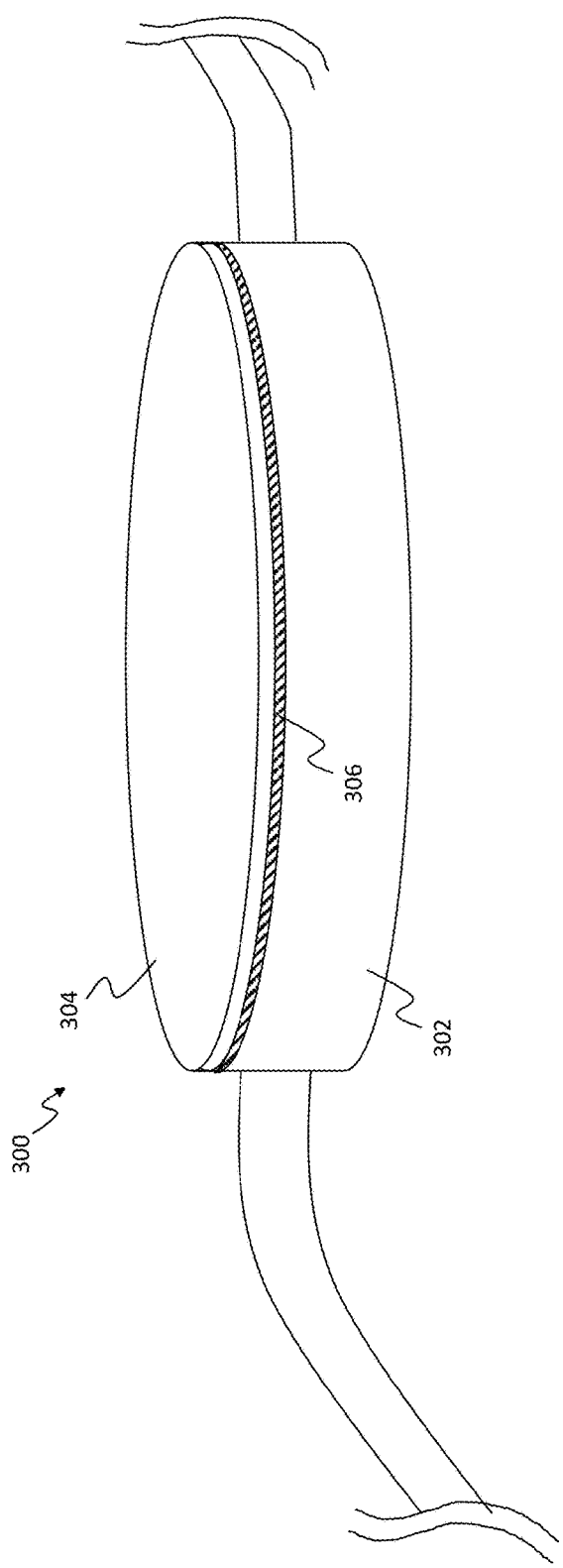

FIG. 1C depicts an example of a haptic-enabled user interface device 300 that is a wearable device, such as an electronic watch. The haptic-enabled user interface device 300 includes a user input component 304 that is a touch screen, and a base 302 for supporting the user input component 304. In an embodiment, the base 302 and the user input component 304 may form at least a portion of a housing of the haptic-enabled user interface device 300. The haptic-enabled user interface device 300 may further include an elastomer suspension 306 for suspending the user input component 304 on the base 302, such that the user input component 304 does not directly touch the base 302. The elastomer suspension 306 may deform when a user presses on the user input component 304, thus providing a feeling of a mechanical click. As a result, the elastomer suspension 306 may allow the user input component 304 to act as not only a touch screen, but also as a mechanical button that can be clicked.

Figure 2A:
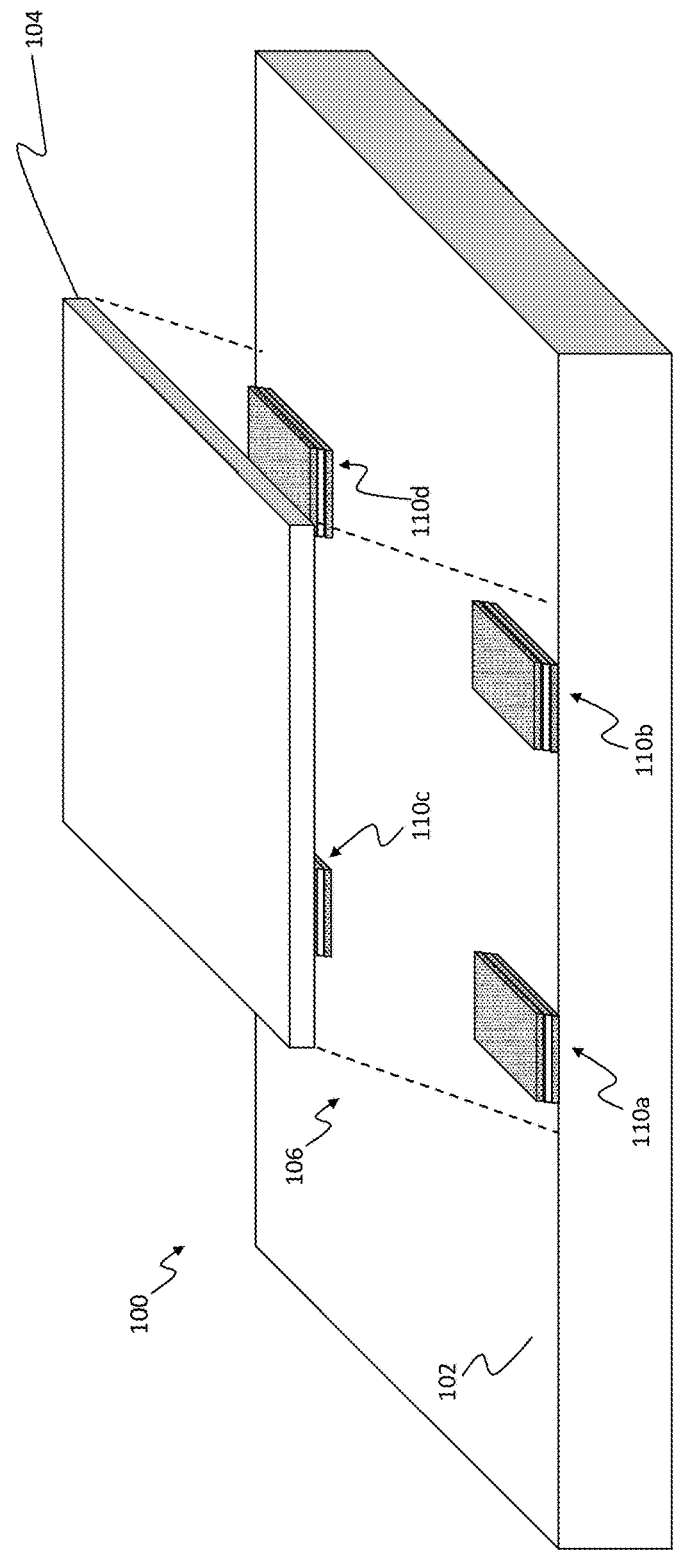
Figure 2B:
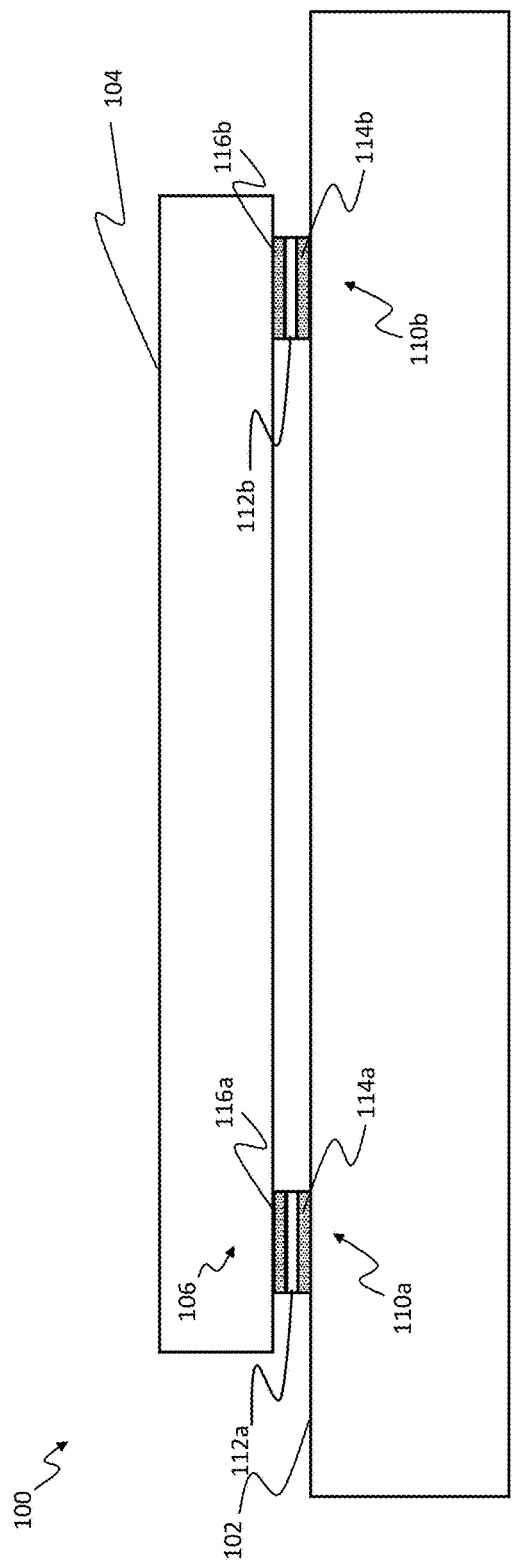

FIG. 2A depicts an exploded view of the elastomer suspension 106 in accordance with an embodiment hereof. More specifically, FIG. 2A provides an exploded perspective view of the haptic-enabled device 100 and of the elastomer suspension 106 between the user input component 104 and the base 102. In the embodiment of FIG. 2A, the elastomer suspension 106 is formed by four stacks 110a, 110b, 110c, 110d, each of which includes an elastomer material and a pair of electrodes on opposite sides of the elastomer material. Each of the stacks may form a capacitor. More specifically, FIG. 2B provides a side view of the haptic-enabled user interface device 100 and of the first stack 110a and the second stack 110b of the elastomer suspension 106. As illustrated in FIG. 2B, the first stack 110a includes a layer 112a of elastomer material, which may also be referred to as an elastomeric layer 112a or as a patch of elastomer material. The first stack 110a also includes two electrodes 114a, 116a on opposite sides of the elastomeric layer 112a. The second stack 110b includes a layer 110b of elastomer material, or an elastomeric layer 112b, and two electrodes 114b, 116b on opposite sides of the elastomeric layer 112b of elastomer material. The first stack 110a may form a first capacitor, and the second stack 110b may form a second capacitor. In an embodiment, each of the stacks 110a-110d includes only a layer of elastomer material, such as a dielectric elastomer material, and the pair of electrodes, and any adhesive used to bond the elastomer material to the electrodes.

In an embodiment, an elastomer material of elastomeric layers 112a, 112b may be sufficiently soft so as to provide a suspension that isolates the base 102 from the user input component 104, and/or sufficiently soft to deform when a user performs a button click on the user input component 104, or otherwise presses on the user input component 104. For instance, the elastomer material may be a polymer that has a Young's Modulus in a range of 10 MPa to 100 MPa, or in a range of 5 MPa to 50 MPa, or in a range of 1 MPa to 80 MPa. In an embodiment, the elastomer material in an undeformed state may have a durometer that is in a range of shore 00-10 to shore A-50. In an embodiment, the elastomer material includes at least one of polyisoprene, isobutylene, isoprene, polybutadiene, styrene-butadiene rubber, ethylene propylene rubber, polyacrylic rubber, or silicone rubber. In an embodiment, one or more of the elastomer materials may stretch outward along one axis, e.g., along a length or width dimension, if they are compressed via a pressure-based touch input along another axis, e.g., along a thickness dimension. In an embodiment, the elastomer material may have a relative dielectric permittivity of 10 to 100, or 10 to 200.

In an embodiment, the electrodes (e.g., 114a, 116a, 114b, 116b) may be bonded to a respective elastomeric layer, e.g., elastomeric layer 112a, 112b, via an adhesive. In an embodiment, the electrodes 114a, 116a and the electrodes 114b, 116b may be formed from, e.g., a conductive material that is stretchable along at least a length and/or width of each of the electrodes. Such a stretchable material may allow the electrodes 114a, 116a, 114b, 116b to stretch or shrink with the elastomeric layer 112a and/or elastomeric layer 112b, along a length and/or a width of the elastomeric layer 112a and/or elastomeric layer 112b. In an embodiment, the stretchable conductive material may include graphene, a metal film, and/or carbon nanotubes.

In an embodiment, each of the stacks 110a, 110b, 110c, 110d may have the same structure, e.g., the same number of layers, the same dimensions, or a combination thereof. In an embodiment, stacks 110a, 110b, 110c, 110d that form an elastomer suspension 106 may have different structures. For instance, the stacks 110a, 110b, 110c, 110d may have different surface areas. In an embodiment, each of the elastomeric layers 112a, 112b may have a thickness that is in a range of, e.g., 0.1 mm to 10 mm. In an embodiment, each of the electrodes 114a, 116a, 114b, 116b may have a thickness that is in a range of 100 nm to 1 µm. Thus, in an embodiment, each stack of the stacks 110a-110d may have a thickness that is a range between 0.1 mm and 10 mm. The layers 112a, 112b and the electrodes 114a, 116a, 114b, 116b may have the same surface area, or may have different surface areas. In an embodiment, each of the elastomeric layers 112a, 112b and the electrodes 114a, 116a, 114b, 116b may have a surface area that is in a range of 16 mm$^2$ and 100 mm$^2$. The above thickness and surface area values refer to an undeformed state, also referred to as a baseline state, of the elastomer suspension 106. As discussed in more detail below, the elastomer suspension 106 may have an actuation functionality in which the elastomer suspension 106 is vibrated. In certain instances, the elastomer suspension 106 may have a resonance frequency at which it is optimal to vibrate the elastomer suspension 106. In an embodiment, the resonance frequency may be in a range that is between 10 Hz and 200 Hz, or between 10 Hz and 500 Hz.

While FIGS. 2A and 2B illustrate an embodiment of an elastomer suspension 106 that includes four stacks with an elastomer material layer, other embodiments of the elastomer suspension 106 may include a different number of stacks. For instance, another embodiment of the elastomer suspension 106 may include only one stack formed from a layer of an elastomer material and two electrodes disposed on opposite sides of the elastomer material layer. In such an example, the stack may be disposed between a center of the user input component 104 and the base 102. In another embodiment, the elastomer suspension may include two, three, or some other number of stacks that each has an elastomer material layer.

In an embodiment, an elastomer suspension 106 of the haptic-enabled user device 100 may be deformable to provide a sensing functionality and/or actuation functionality. The deformation may involve deformation of the elastomer material in the elastomer suspension 106. For instance, FIGS. 2C and 2D illustrate an example of deformation of an elastomer layer 112a in a stack 110a of an elastomer suspension 106. FIG. 2C illustrates a shape of the stack before it is deformed by a pressure-based touch input or by a drive signal (discussed below) used to generate haptic actuation. This shape may be referred to as an original shape or baseline shape of the stack 110a. In FIG. 2C, the baseline shape of the stack 110a has a baseline thickness $t_{baseline}$, also referred to as a baseline or original distance $d_{original/baseline}$ or an original thickness $t_{original}$ of the elastomeric layer 112a, that separates the electrodes 116a, 114a of the stack 110a, and the electrodes 116a, 114a have a baseline surface area A, also referred to as an original surface area. FIG. 2D illustrates the stack 110a after it has been deformed by a pressure-based touch input or a drive signal. In FIG. 2D, the elastomeric layer 112a may have been deformed to a reduced thickness $t_{deformed}$ relative to its baseline thickness $t_{baseline}$. In an embodiment, as the elastomeric layer 112a decreases in thickness, the elastomer material may permit elastomeric layer 112a to stretch radially outward along a length and/or width thereof in the deformed state. In an embodiment, as discussed above, the electrodes 116a, 114a may be bonded to the elastomeric layer 112a, and may be sufficiently stretchable to also be stretched outward along a length and/or width thereof. In such an embodiment, the surface area A of the electrodes 116a, 114a may be increased as a result of the deformation of the stack 110a.

Figure 3A:
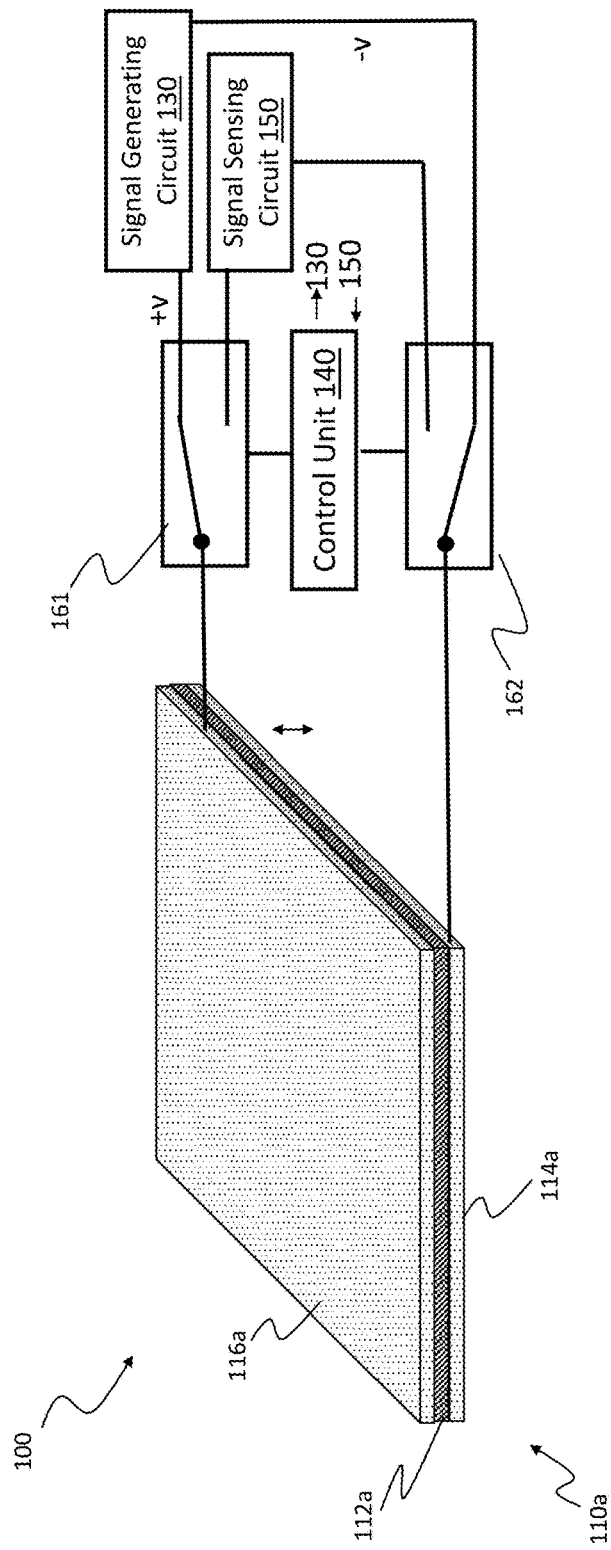
FIGS. 3A-3D illustrate various configurations of one or more switches, a signal generating circuit, and a signal sensing circuit, according to embodiments hereof.

In an embodiment, a haptic actuation functionality may be facilitated with a signal generating circuit that provides a drive signal for the elastomer suspension 106, while a sensing functionality may be facilitated with a signal sensing circuit that senses a signal from the elastomer suspension 106. For instance, FIG. 3A illustrates the haptic-enabled user interface device 100 having a signal generating circuit 130, a signal sensing circuit 150, a control unit 140, and a plurality of switches 161, 162. The control unit 140 may be configured to control the switches 161, 162 to electrically connect the electrodes 114a, 114b of the first stack 110a to the signal generating circuit 130 and to electrically disconnect the electrodes 114a, 114b from the signal sensing circuit 150. The control unit 140 may further be configured to control the switches 161, 162 to subsequently electrically connect the electrodes 114a, 116a of the first stack 110a to the signal sensing circuit 150, and to electrically disconnect the electrodes 114a, 116a from the signal generating circuit 130. Each switch of the switches 161, 162 may be, e.g., a relay switch, a transistor or other semiconductor switch, or any other type of switch.

Figure 3B:
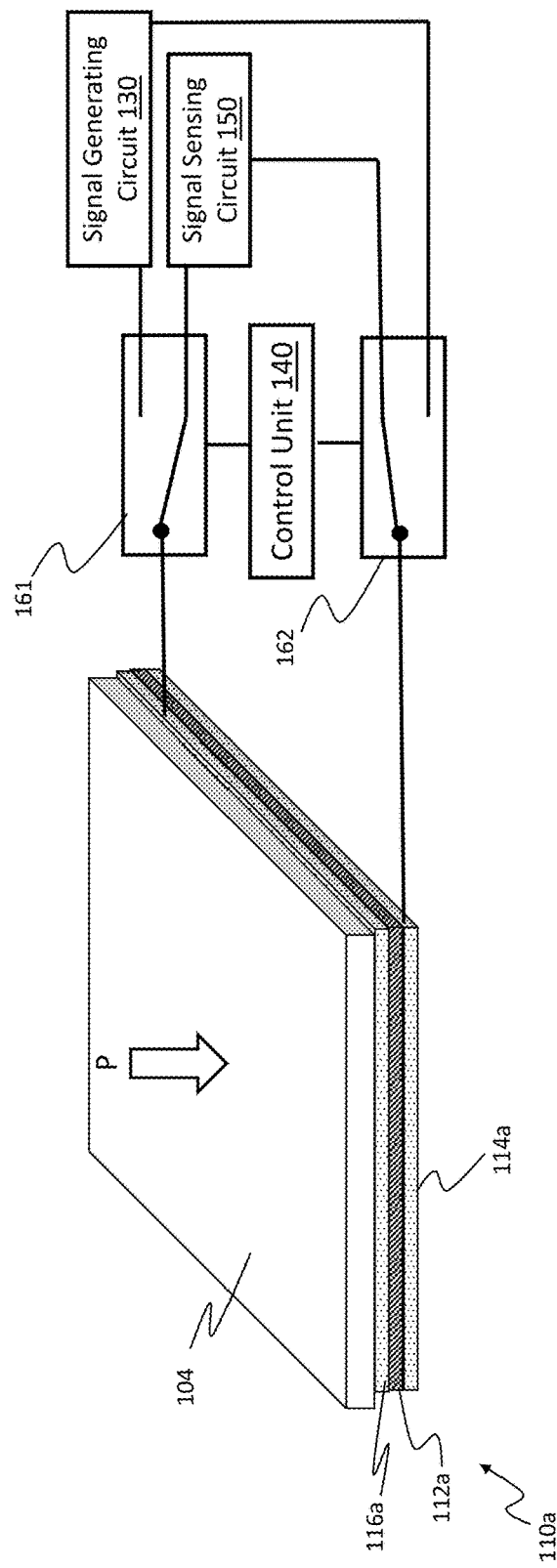
Figure 3C:
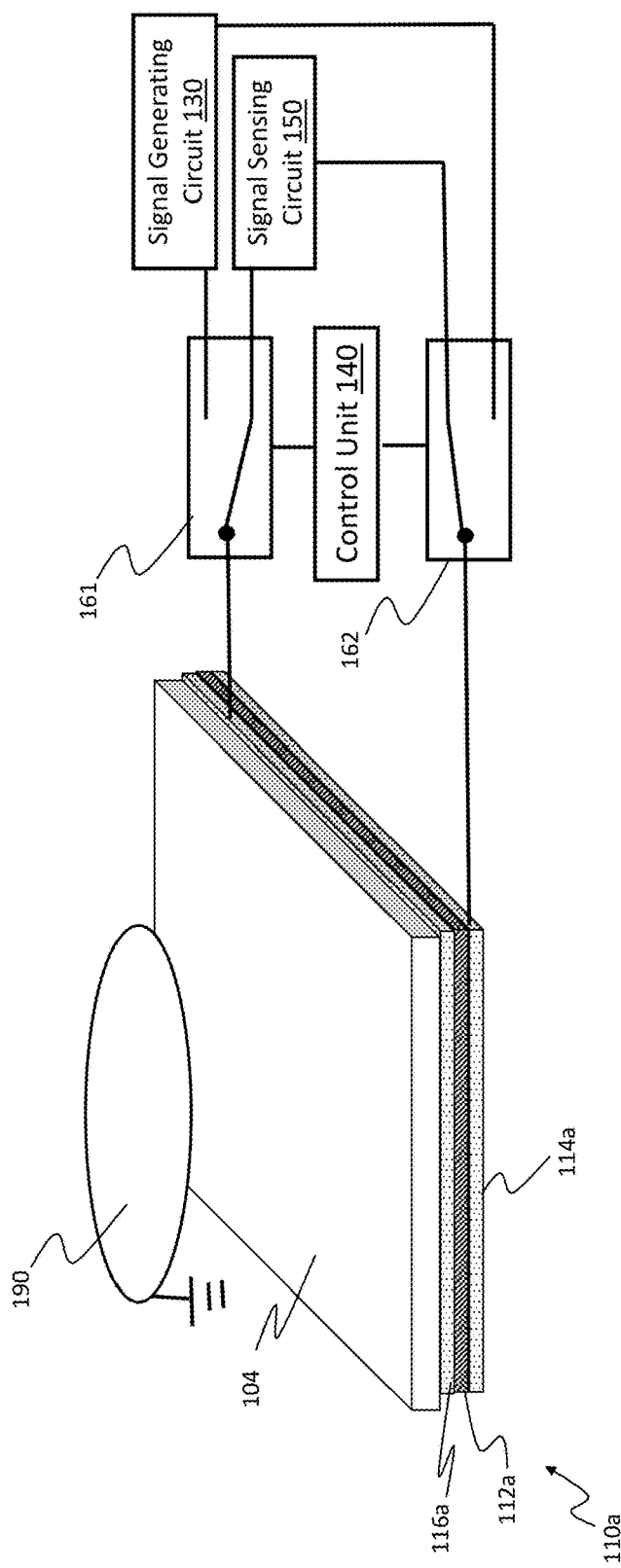
Figure 3D:
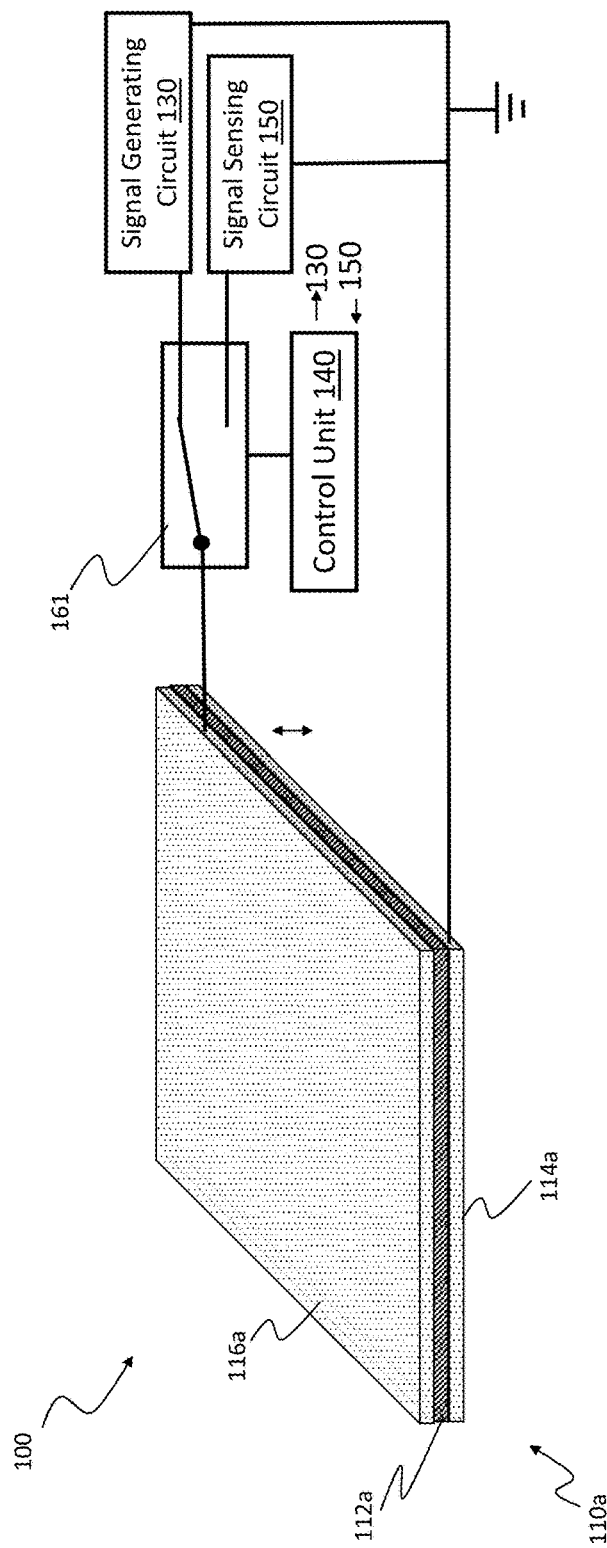

In an embodiment, the control unit 140 may have an actuation mode in which it uses the signal generating circuit 130 and the stack 110a of the elastomer suspension 106 to generate a haptic effect. In the actuation mode, the control unit 140 may cause the switches 161, 162 to electrically connect the signal generating circuit 130 to the electrodes 114a, 116a of the stack 110a, and to electrically disconnect the signal sensing circuit 150 from the electrodes 114a, 116a, as illustrated in FIG. 3A. The signal sensing circuit 150 may be disconnected so that strong drive signals from the signal generating circuit 130 do not reach the signal sensing circuit 150, which may be damaged by such strong drive signals. The control unit 140 may further control the signal generating circuit 130 to apply a first signal to the electrodes 114a, 116a of the stack 110a after they have been electrically connected to the signal generating circuit 130. The first signal may be simultaneously applied to the electrodes of the other stacks of the elastomer suspension. Alternatively, the first signal may be applied to only the electrodes 114a, 116a of the first stack 110a, and any other stack of the elastomer suspension 106 may receive a different signal from the signal generating circuit 130 at another time. The signal may be applied in a differential mode or a single-ended mode. For instance, FIG. 3A illustrates the signal being applied in a differential mode, in the signal is applied as a difference between a voltage or current on electrode 116a and a voltage or current on electrode 114a, e.g., as a difference between +v and −v. In another instance, as illustrated in FIG. 3D, the signal may be applied in a single-ended mode. In this mode, the signal generating circuit 130 applies the first signal as a voltage or current on the electrode 116a. The signal is single-ended in that it is defined relative to a ground potential, which is provided by electrode 114a. More specifically, electrode 114a in this instance defines a ground potential for the signal generating circuit 130 and the signal sensing circuit 150.

As discussed above, the control unit 140 may enter an actuation mode in response to a determination to generate a haptic effect. In an embodiment, the control unit 140 in the actuation mode may cause the signal generating circuit 130 to apply a first signal that is a drive signal to the stack 110a, such as to the electrodes 114a, 116a of the stack 110a in FIG. 3A. For instance, the drive signal may be a periodic signal with an amplitude that is at least 50 V, at least 500 V, or at least 1 kV. In FIG. 3A, the drive signal may be a differential signal, in which the periodic waveform with amplitude of at least 50 V, 500 V, or 1 kV refers to a difference between respective voltages (or currents) on electrodes 116a, 114a. The drive signal may need to have sufficiently high amplitude to generate electrostatic attraction between the pair of electrodes 116a, 114a, as discussed below in more detail.

In an embodiment, a control unit 140 may include, e.g., a general purpose processor, a field programmable gate array (PGA), a programmable logic array (PLA), or any other type of control circuit. In an embodiment, a control unit 140 may also be used to perform other functions of a haptic-enabled user interface device 100, such as to execute an operating system and/or perform signal processing functionality of the device 100. In an embodiment, a control unit 140 may be dedicated to controlling actuation functionality and sensing functionality of an elastomer suspension 106.

In an embodiment, a drive signal generated by a signal generating circuit 130 for an actuation mode may be a periodic signal, such as a sinusoidal signal or a square wave. In an embodiment, a drive signal may cause one or more stacks 110a-110d of an elastomer suspension 106 to vibrate. More specifically, the periodic signal may cause the one or more stacks to alternate between moving to a deformed state (e.g., a deformed shape) and returning to a baseline state (e.g., baseline shape), wherein such a movement may vibrate the one or more stacks. For instance, a square wave may include a series of pulses that are separated by periods of zero amplitude. When a pulse of the square wave is applied to an electrode 116a, the pulse may cause the electrode 116a to have a net positive charge or net negative charge. The net positive charge or net negative charge on the electrode 116a may induce an opposite charge on the electrode 114a. As a result, the electrodes 116a, 114a may be attracted toward each other. If the amplitude of the drive signal is sufficiently high, the force of attraction may be sufficient to move the electrodes 114a, 116a toward each other, by deforming the elastomeric layer 112a. In other words, the attraction between the electrodes 114a, 116a may squeeze the elastomeric layer 112a to cause the elastomeric layer 112a to decrease in thickness, as illustrated in FIG. 2D. Such a deformation of the elastomeric layer 112a also allows the electrodes 114a, 116a to move toward each other. As stated above, the pulse in the square wave may be followed by a period of zero amplitude. In this period, an elastomer suspension 106 may return to its baseline state (e.g., to its baseline shape). More specifically, the elastomeric layer 112a may be a resilient material (also referred to as an elastic material) that returns from a deformed state to an undeformed state after a force causing the deformation is removed. That is, once the pulse is over, there is no longer a force of attraction squeezing the elastomeric layer 112a, so that the elastomeric layer 112a may spring back to its baseline shape, such as that illustrated in FIG. 2C. This restoration of the elastomeric layer 112a to its baseline shape may also move the electrodes 114a, 116a away from each other, to their respective baseline positions in which they are separated by the baseline distance $d_{baseline}$ (shown as $t_{baseline}$ in FIG. 2C) and have the baseline surface area A of FIG. 2C. If the drive signal is periodic, such as a square wave that includes a series of pulses, or a sinusoidal signal that oscillates between a non-zero value and a zero value, the stacks of the elastomer suspension 106 may thus oscillate between the baseline shape and the deformed shape. Such an oscillation may cause the elastomer suspension 106 to vibrate, and such a vibration may be transferred to the user input component 104 and/or to the base 102 to generate a vibrotactile haptic effect. In an embodiment, the control unit 140 may be configured to control, e.g., when the signal generating circuit 130 is activated, a type of signal to be generated by the signal generating circuit 130, e.g., a square wave, sinusoidal signal, sawtooth signal, an amplitude of a signal to be generated by the signal generating circuit, a frequency or phase of a signal, a duty cycle of a signal, or any combination thereof.

In an embodiment, the control unit 140 may have a sensing mode in which the control unit determines, based on a signal sensed by the signal sensing circuit 150, whether a user input, e.g., a pressure-based touch input, has been received by the haptic-enabled user interface device 100, or more specifically whether a user input has been received at a user input component. In the sensing mode, the control unit 140 may be configured to cause the switches 161, 162 to electrically connect the signal sensing circuit 150 to electrodes 114a, 116a of the stack 110a, as illustrated in FIG. 3B. The signal sensing circuit 150 may simultaneously be electrically connected to all of the stacks of the elastomer suspension 106, or may be electrically connected to different stacks of the elastomer suspension 106 at different times. For example, the signal sensing circuit 150 may be electrically connected to different stacks of the elastomer suspension 106 in a sequential manner. In FIG. 3B, the signal sensing circuit 150 may be configured to sense a signal that is in a differential mode. In other words, the signal sensing circuit 150 may sense a signal as a difference between respective voltages (or currents) on the electrodes 116a, 114a. In another embodiment, as illustrated in FIG. 3D, the signal sensing circuit 150 may be configured to sense a signal that is in a single-ended mode, in which the signal is referenced to a ground potential defined by one of the electrodes, e.g., 114a.

Returning to FIG. 3B, the sensing mode in an embodiment may be used to sense pressure P from a pressure-based touch input being applied to the user input component 104. When the user applies a pressure P to the user input component 104, at least a portion of the pressure P may be transferred to the stack 110a, as illustrated in FIG. 3B, and/or to other stacks of the elastomer suspension 106. The pressure P may deform the elastomer suspension 106, and more specifically may deform the elastomeric layer 112a in the stack 110a and/or a layer of elastomer material in another stack of the suspension 106, in a manner similar to the deformation depicted in FIG. 2D. The control unit 140 may, in a sensing mode, be configured to use the stack 110a and the signal sensing circuit 150 to detect such a deformation. Thus, in the sensing mode, the control unit 140 may cause the switches 161, 162 to electrically connect the signal sensing circuit 150 to the electrodes 114a, 116a of the stack 110a.

Figure 4A:
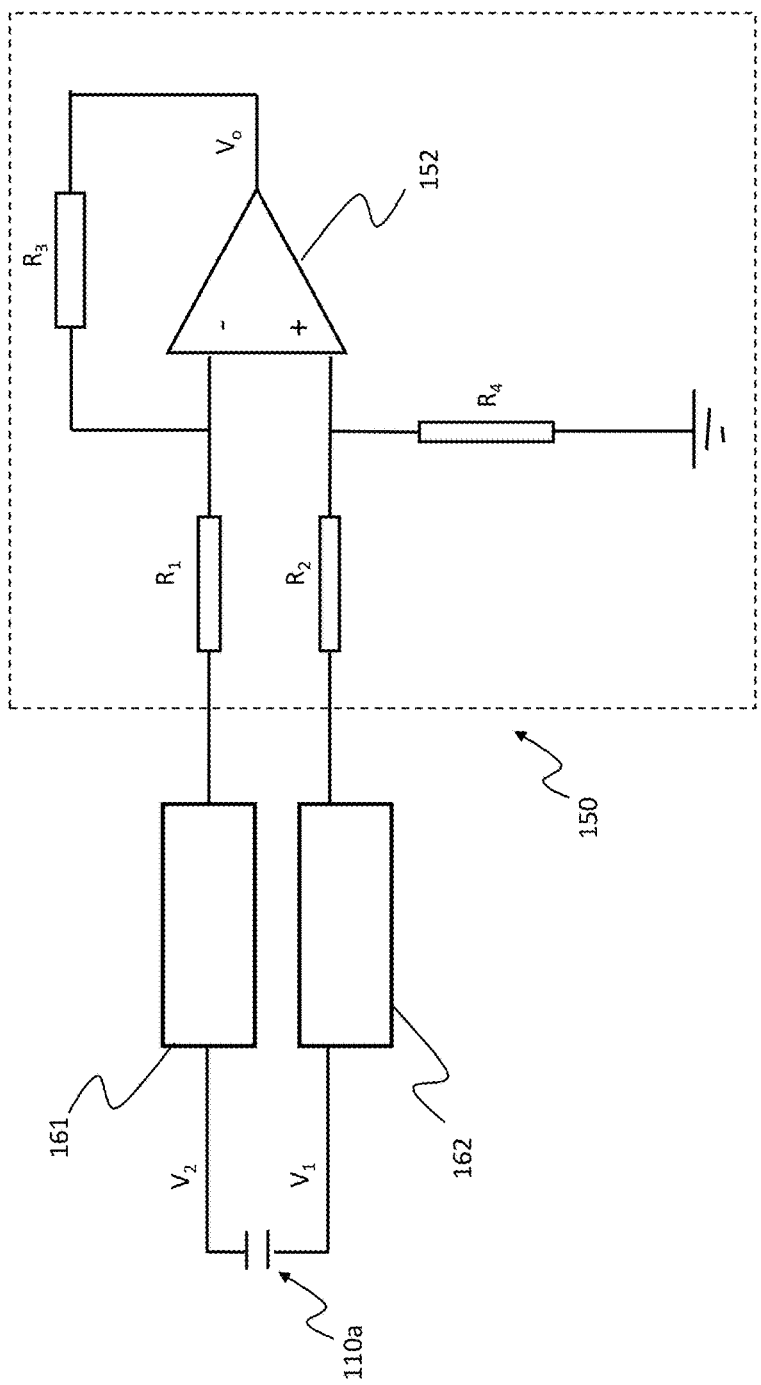
FIGS. 4A-4C illustrate various embodiments of a signal sensing circuit, according to an embodiment hereof.

In an embodiment, when the pressure P deforms the elastomer material of the elastomeric layer 112a, the elastomer material may be configured to generate a signal. In such an embodiment, the elastomer material may be configured to convert mechanical input to an electrical output. The signal sensing circuit 150 may be configured to sense the signal that is generated by the elastomer material. For instance, FIG. 4A illustrates an example of the signal sensing circuit 150. In this example, the signal sensing circuit 150 includes an operational amplifier 152 and a plurality of resistors $R_1$ through $R_4$. If the resistors $R_1$ through $R_4$ have the same resistance, then an output voltage $v_o$ may be equal to $v_2-v_1$, wherein $v_2$ is a voltage on electrode 116a, and $v_1$ is a voltage on electrode 114a. Any other circuit topology, e.g., a Wheatstone topology, may be used in addition to or in lieu of the circuit topology shown in FIG. 4A.

Figure 4B:
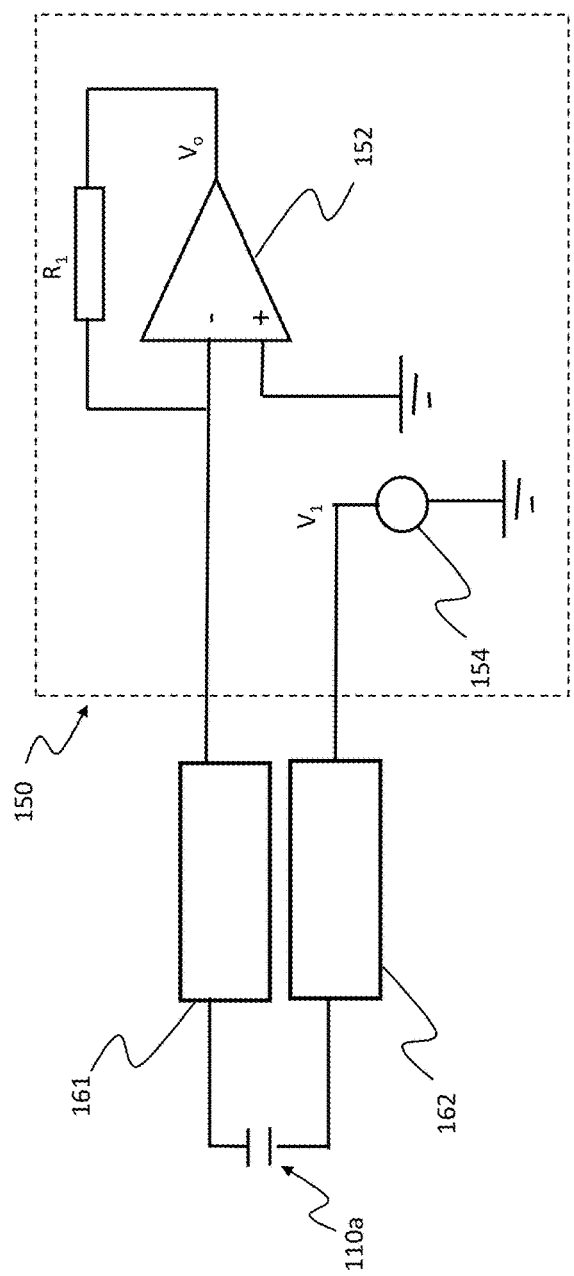

In an embodiment, when the pressure P deforms the elastomer material of the elastomeric layer 112a, such as from a pressure-based touch input, the control unit 140 may be configured to detect the deformation by determining whether there is a change in capacitance of any of the capacitors formed by the respective stacks 110a-110d. If a change in capacitance of any of the capacitors, relative to a defined or measured capacitance, e.g., a baseline capacitance, is more than a defined threshold, the control unit 140 may determine that there is a pressure-based touch input. As discussed above, the elastomer material may be configured to convert a mechanical input to an electrical output, and thus generate an electrical signal in response to being deformed. In another embodiment, however, the elastomer material is not configured to generate an electrical signal in response to being deformed. In such an embodiment, the signal sensing circuit 150 may be configured to generate its own signal to detect a change in capacitance of the elastomer material. For instance, FIG. 4B depicts an example of a signal sensing circuit 150 that has a signal generating circuit 154, an operational amplifier 152, and a resistor $R_1$. In some cases, the signal generating circuit 154 is different than the signal generating circuit 130. In such cases, the signal generating circuit 130 is electrically disconnected from both electrodes 114a, 116a of the stack 110a in the sensing mode. In other cases, the signal generating circuit 154 may share components with the signal generating circuit 130, or may be the same as the signal generating circuit 130.

In the example illustrated in FIG. 4B, the output voltage $v_o$ of the signal sensing circuit 150 may be calculated as $v_1 cfr$, wherein $v_1$ is an amplitude of a sinusoidal signal generated by the signal generating circuit 154, f is a frequency of the sinusoidal signal, c is a capacitance of the capacitor formed by the stack 110a, and r is a resistance of $R_1$. In an embodiment, the signal generating circuit 154 may be configured to limit an amplitude of $v_1$ to a range that is between 0.1 V and 5 V. The control unit 140 may be configured to calculate the capacitance as $c=v_o/(v_1 fr)$, and determine whether the capacitance has changed by at least a threshold amount. If the capacitance has changed by at least a threshold amount, the control unit 140 may determine that a pressure-based touch input has been received.

In an embodiment, the capacitance in the capacitor formed by stack 110a may depend on a surface area A of the electrodes 116a, 114a and on a distance d separating the electrodes 116a, 114a. For instance, the capacitance may be based on $A\varepsilon/d$, wherein $\varepsilon$ is a dielectric constant of the elastomeric layer 112a. A pressure-based touch input may decrease the thickness of the elastomeric layer 112a, which may decrease the distance d separating the electrodes 116a, 114a, and/or increase the surface area A of the electrodes 116a, 114a. As a result, a capacitance of the capacitor formed by the stack 110a may be increased. The increased capacitance may be reflected in, e.g., a decreased amount of attenuation between $v_1$ and $v_o$ in FIG. 4B. In an embodiment, the change in capacitance may be detected by determining whether a phase shift between $v_o$ and $v_1$ has changed by at least a threshold amount. In another embodiment, the change in capacitance may be detected by determining whether a change in voltage ramp-up time has changed by at least a threshold amount, wherein the voltage ramp-up time may refer to how long it takes the voltage to reach (1−1/e), or 63%, of a steady state value, and may be equal to $\tau=r*c$. In an embodiment, the circuit in FIG. 4B may be augmented or replaced with any other sensing circuit, such as an AC bridge, a linear oscillator, a diode pump, or any other sensing circuit.

In an embodiment, a control unit 140 may be configured, in a sensing mode, to determine location-based information for a pressure-based touch input. For instance, the control unit 140 may be configured to receive a signal from each stack of the stacks 110a-110d, and/or determine a change in capacitance for each stack of the stacks 110a-110d. If the signal amplitude or change in capacitance of a first stack 110a of the stacks 110a-110d is higher than that of the other stacks, the control unit 140 may determine that the pressure-based touch input is closer a location of the first stack 110a. In an embodiment, the control unit 140 may associate the four stacks 110a-110d with four zones, respectively, on a surface of a user input component 104. By determining the location-based information for the pressure-based touch input, the control unit 140 may be configured to determine which zone of the four zones was pressed.

In an embodiment, an elastomer suspension 106 may be used to detect non-contact proximity of an object, such as non-contact user proximity. For instance, FIG. 3C depicts an embodiment in which a control unit 140 is in a sensing mode and is configured to detect proximity of an object 190 such as a user's finger, other body part, a stylus, or other object that is in proximity but not in contact with a user input component 104. In an embodiment, the proximity that is detected may be in a range of 0.1 mm to 10 mm between the object 190 (finger or other object) and the user input component 104. In an embodiment, detection of an object's proximity may also be based on detecting a change in capacitance of one or more capacitors formed by one or more respective stacks 110a-110d of the elastomer suspension 106. The capacitance between the electrodes 116a, 114a of the stack 110a, for example, may be affected by the presence of the object 190, such as a user's finger, which may affect fringe electric field lines emanating from the electrode 116a, and/or provide another capacitive path to ground for a measurement signal on the electrode 116a. In an embodiment, the circuit in FIG. 4B or another capacitance detection circuit may be used to detect a change in capacitance of the capacitor formed by stack 110a.

In an embodiment, a control unit 140 may be configured to distinguish between a pressure-based touch input and a non-contact proximity of an object based on an amount of change in capacitance relative to a baseline capacitance in which there is no deformation of an elastomer suspension 106 nor proximity of an object. In an embodiment, the control unit 140 may be configured to distinguish between a pressure-based touch input and a non-contact proximity of an object based on an amount of change in an output voltage $v_o$ of the signal sensing circuit 150 relative to a baseline voltage associated with no deformation of the elastomer suspension 106 nor proximity of the object. For instance, the pressure-based touch input may be associated with an amount of change in capacitance or amount of change in the signal $v_o$ that is in a first defined range, while the non-contact proximity of an object may be associated with an amount of change in capacitance or amount of change in the signal $v_o$ that is in a second defined range. In an embodiment, deformation from the pressure-based touch input may cause a greater amount of change in the capacitance and/or in the signal $v_o$ of the signal sensing circuit 150, relative to that caused by the non-contact proximity of an object, such as non-contact user proximity. In an embodiment, deformation from the pressure-based touch input may cause an amount of change in the capacitance and/or in the signal $v_o$ that is in a first direction (e.g., an increase in the capacitance or signal amplitude), while the non-contact proximity of an object may cause an amount of change in the capacitance and/or the signal $v_o$ that is in an opposite direction, e.g., a decrease in the amount or signal amplitude. Thus, in an embodiment, the control unit may be configured to determine that a pressure-based touch input has been detected in response to a determination that the change in capacitance is in a first range, and may be configured to determine that non-contact proximity of an object has been detected in response to a determination that the change in capacitance is in a second range.

In an embodiment, a control unit 140 may further be configured to distinguish between pressure-based touch input, which may be sufficient to deform an elastomeric layer 112a of an elastomer suspension 106, a touch input that is not sufficient to deform the elastomeric layer 112a, and a non-contact proximity of an object 190. In an embodiment, the control unit 140 may determine that a pressure-based touch input has been detected if an amount of change in capacitance of a stack 110a or of the signal $v_o$ of the signal sensing circuit 150 is in a first defined range. It may be configured to determine that non-contact proximity of an object has been detected if an amount of change in capacitance of the stack 110a or of the signal $v_o$ the signal sensing circuit 150 is in a second defined range different than the first defined range. Further, it may be configured to determine that a touch input other than a pressure-based touch input has been detected if an amount of change in capacitance of the stack 110a or of the signal $v_o$ of the signal sensing circuit 150 is in a third defined range different than the first and second defined ranges.

Figure 4C:
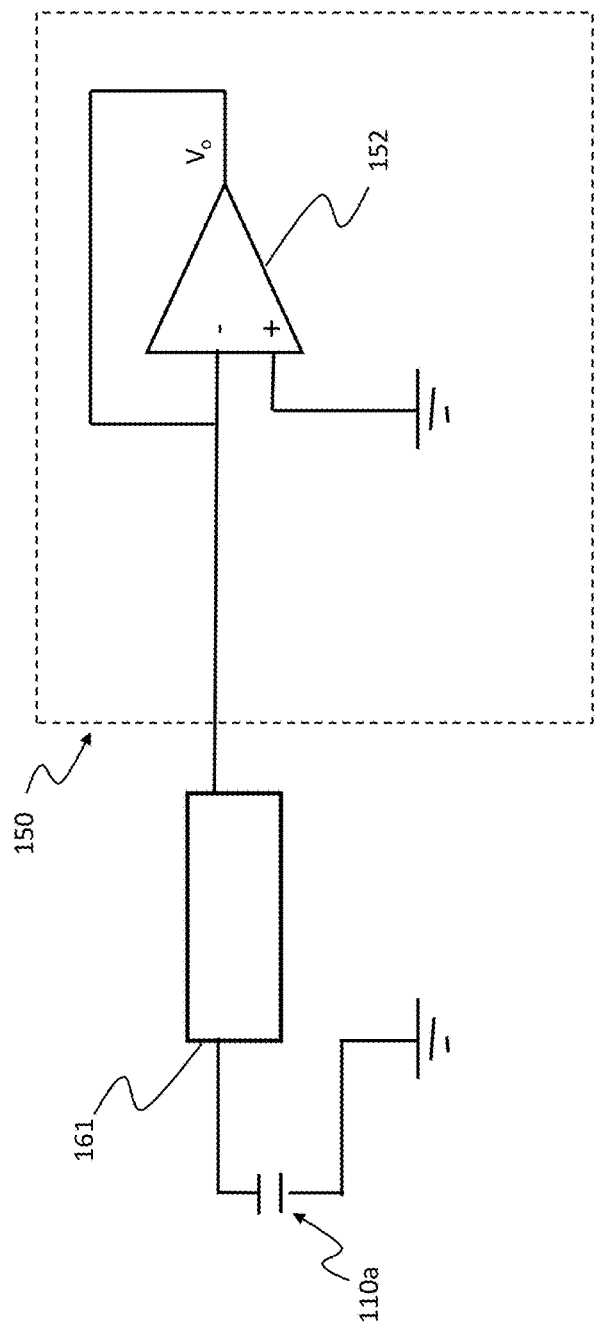

In an embodiment, the signal generating circuit 130 may be configured to apply a signal in a single-ended mode, and the signal sensing circuit 150 may be configured to detect a signal in a single-ended mode, as illustrated in FIG. 3D. More specifically, FIG. 3D illustrates a user interface device 100 in which electrode 114a of the stack 110a is used as a ground potential for the signal generating circuit 130 and the signal sensing circuit 150. In such an embodiment, the signal generating circuit 130 may be configured to apply a drive signal to electrode 116a, wherein the drive signal is referenced with respect to the ground potential. Further, the signal sensing circuit 150 may be configured to sense a signal from electrode 116a, wherein the sensed signal is referenced with respect to the ground potential. Such an embodiment may include only one switch 161 that is configured to electrically connect one of the signal generating circuit 130 and the signal sensing circuit 150 to the electrode 116a, and the disconnect the other of the signal generating circuit 130 and the signal sensing circuit 150 from the electrode 116a. FIG. 4C illustrates a signal generating circuit 150 that may be used with the embodiment of FIG. 3D. In FIG. 4C, the signal generating circuit 150 includes an operational amplifier 152 that uses negative feedback to cause $v_o$ to equal a signal on the electrode 116a.

Figure 5A:
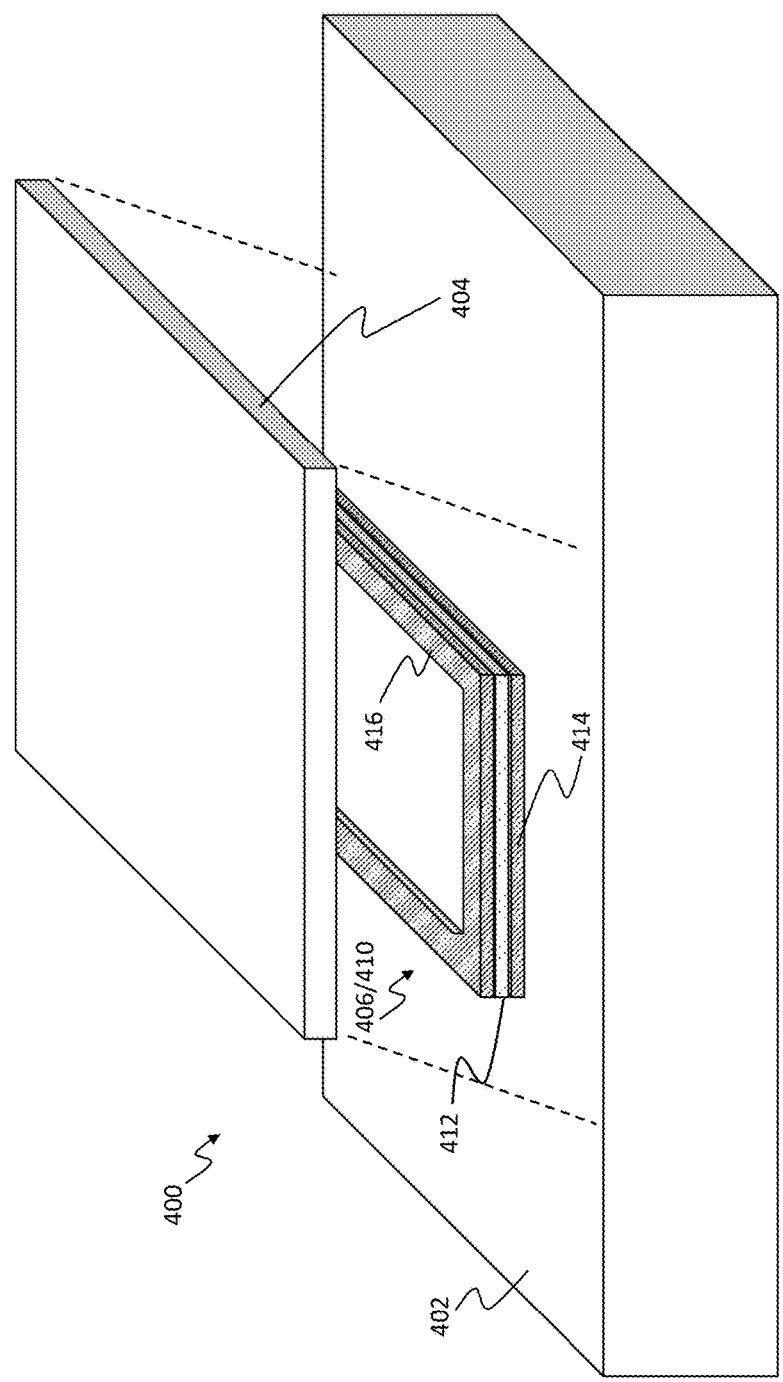
FIGS. 5A and 5B illustrate an elastomer suspension, according to an embodiment hereof.
Figure 5B:
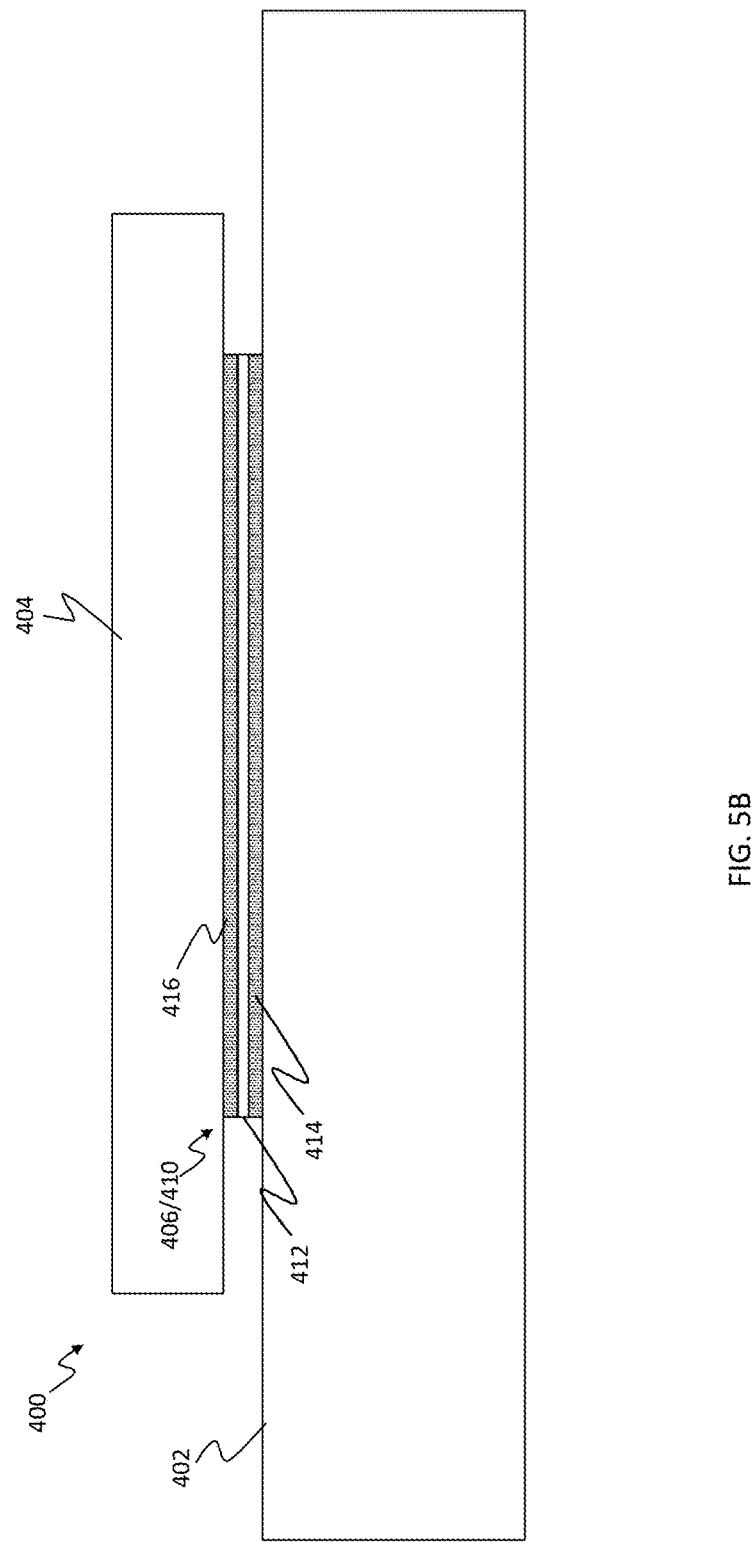

In an embodiment, an elastomer suspension 106 may be configured to form a seal between a user input component and a base. For instance, FIG. 5A depicts a haptic-enabled user interface device 400 that comprises an elastomer suspension 406 that forms a seal between a user input component 404 and a base 402. In an embodiment, the haptic-enabled user interface device 400 may be a mobile phone, while the user input component 404 may be a touch screen, and the base 402 may be a portion of a housing of the mobile phone. In an embodiment, the elastomer suspension 406 may include only a single ring-shaped stack 410 that forms a ring that encloses a space within the haptic-enabled user interface device 400. As illustrated in FIG. 5A, the ring-shaped stack 410 may be formed from a ring-shaped layer 412 of elastomer material, i.e., elastomeric layer 412, and a pair of electrodes 416, 414 disposed on opposite sides of the elastomeric layer 412, see also FIG. 5B. The elastomeric layer 412 and the pair of electrodes 416, 414 may each be ring-shaped, as depicted in FIG. 5A, so as to form the ring-shaped stack 410. The ring-shaped stack 410 may provide a seal for components (e.g., a processor, memory, battery) within a space being enclosed by the stack. Such a seal may provide protection against an external environment. In some cases, the ring-shaped stack 410 may be formed around a periphery of the housing of the haptic-enabled user interface device 400. In an embodiment, the elastomer suspension 306 of the wearable device in FIG. 1C may also be made up of only a single ring-shaped stack 306. The ring-shaped stack 306 may have a circular shape, and may be formed around a periphery of the base 302 of the haptic-enabled user interface device 300.

In an embodiment, an elastomer suspension of the embodiments herein may include a layer of piezoelectric material, also referred to as a patch of piezoelectric material. For instance, the elastomer suspension may leverage ceramic piezoelectric material to provide actuation and/or sensing functionality, and may leverage elastomer material to provide suspension functionality. That is, the ceramic piezoelectric material may rely on a piezoelectric effect to generate movement, and the piezoelectric effect may in certain circumstances be equally effective or more effective at generating movement than the electrostatic attraction that is generated between a pair of electrodes, as discussed above. However, while the ceramic piezoelectric material may be able to deform by a small amount so as to vibrate, the ceramic piezoelectric material may be too rigid to be effective as a suspension. For instance, the ceramic piezoelectric material may itself be unable to provide a feeling of a mechanical click when the ceramic piezoelectric material is being pressed, because the material may be too rigid to deform in response to being pressed. In another example, the ceramic piezoelectric material may be too rigid to isolate a base of a user interface device from a user input component. A layer of elastomer material, on the other hand, may be more effective at providing deformation and isolation properties for a suspension. Thus, in an embodiment, a haptic-enabled user interface device may include a composite elastomer suspension that combines a layer of ceramic piezoelectric material and a layer of elastomer material.

Figure 6A:
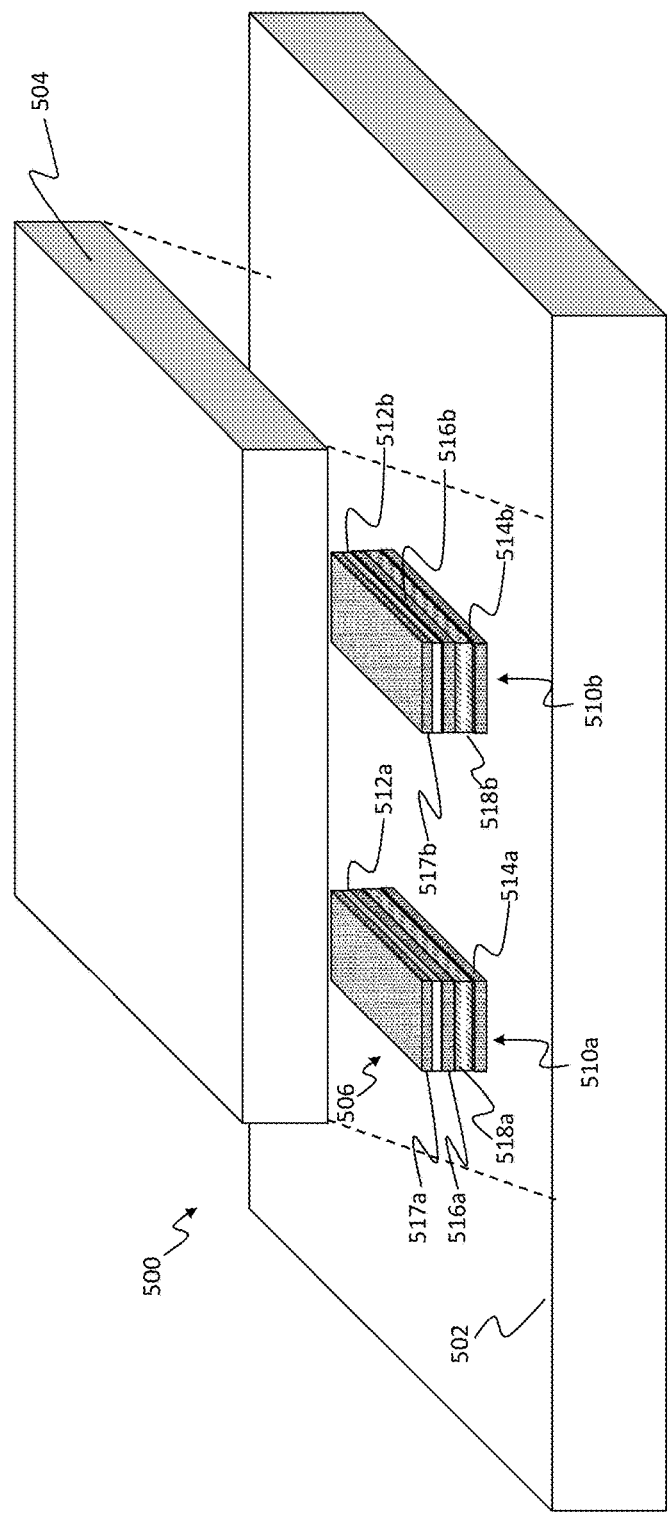
FIGS. 6A and 6B illustrate an elastomer suspension that combines piezoelectric material and elastomer material, according to an embodiment hereof.
Figure 6B:
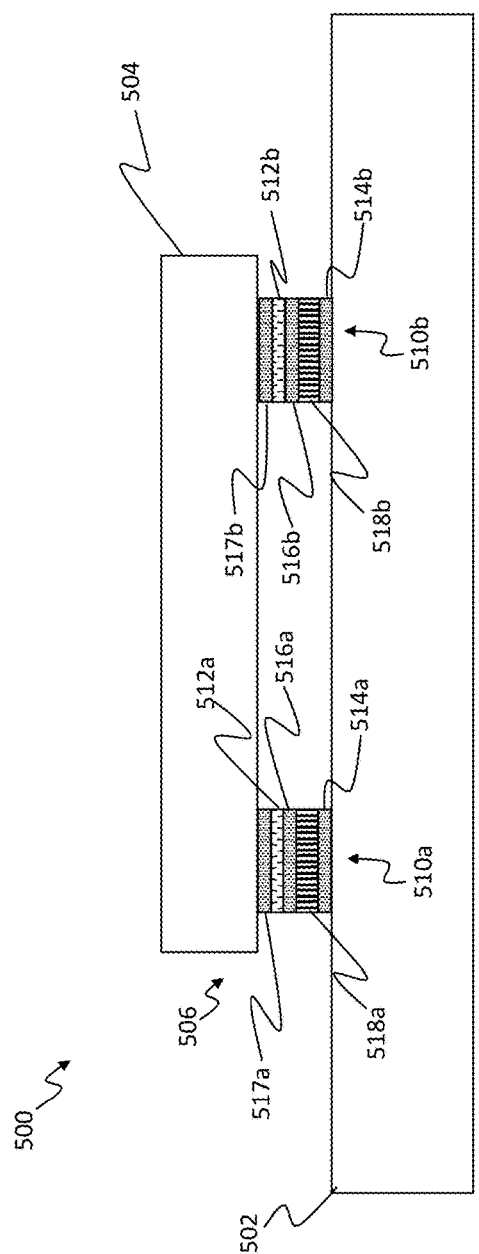

FIGS. 6A and 6B depict a composite elastomer suspension 506 that includes a combination of a layer of ceramic piezoelectric material and a layer of elastomer material. More specifically, the figures depict a haptic-enabled user input device 500 that includes a base 502, a user input component 504, and a composite elastomer suspension 506 that includes a first stack 510a and a second stack 510b. In an embodiment, the first stack 510a and the second stack 510b may be the only two stacks forming the elastomer suspension 506. As illustrated in FIGS. 6A and 6B, the first stack 510a may include a layer 518a of piezoelectric material, i.e., a piezoelectric layer 518a, such as ceramic piezoelectric material, and a layer 512a of elastomer material, i.e., an elastomeric layer 512a, as well as electrodes 516a and 514a directly on opposite sides of the piezoelectric layer 518a, such that they are in electrical contact with the piezoelectric layer 518a. The second stack 510b may include a layer 518b of piezoelectric material, i.e., a piezoelectric layer 518b, and a layer 512b of elastomer material, i.e., an elastomeric layer 512b, as well as electrodes 516b and 514b directly on opposite sides of the piezoelectric layer 518b, such that they are in electrical contact, such as via a conductive adhesive, with the piezoelectric layer 518b. In FIGS. 6A and 6B, the stack 510a may include a third electrode 517a, wherein the elastomer layer 512a is disposed directly between electrode 516a and electrode 517a. Similarly, the stack 510b may have a third electrode 517b, wherein the elastomer layer 512b is disposed directly between electrode 516b and electrode 517b. In an embodiment, the piezoelectric material is a ceramic piezoelectric material that has a Young's Modulus in a range of 100 GPa to 300 GPa, or in a range of 100 GPa to 200 GPa. In this embodiment, the elastomer material may be a polymer that has a Young's Modulus that is in a range of 10 MPa to 100 MPa. In another embodiment, the piezoelectric material is a polymer piezoelectric material with a Young's Modulus that is in a range of 10 MPa to 100 MPa. In an embodiment, the stack 510a includes only the piezoelectric layer 518a, the elastomeric layer 512a, the electrodes 514a, 516a, and any adhesive therebetween, and the third electrode 517a is omitted.

Figure 7A:
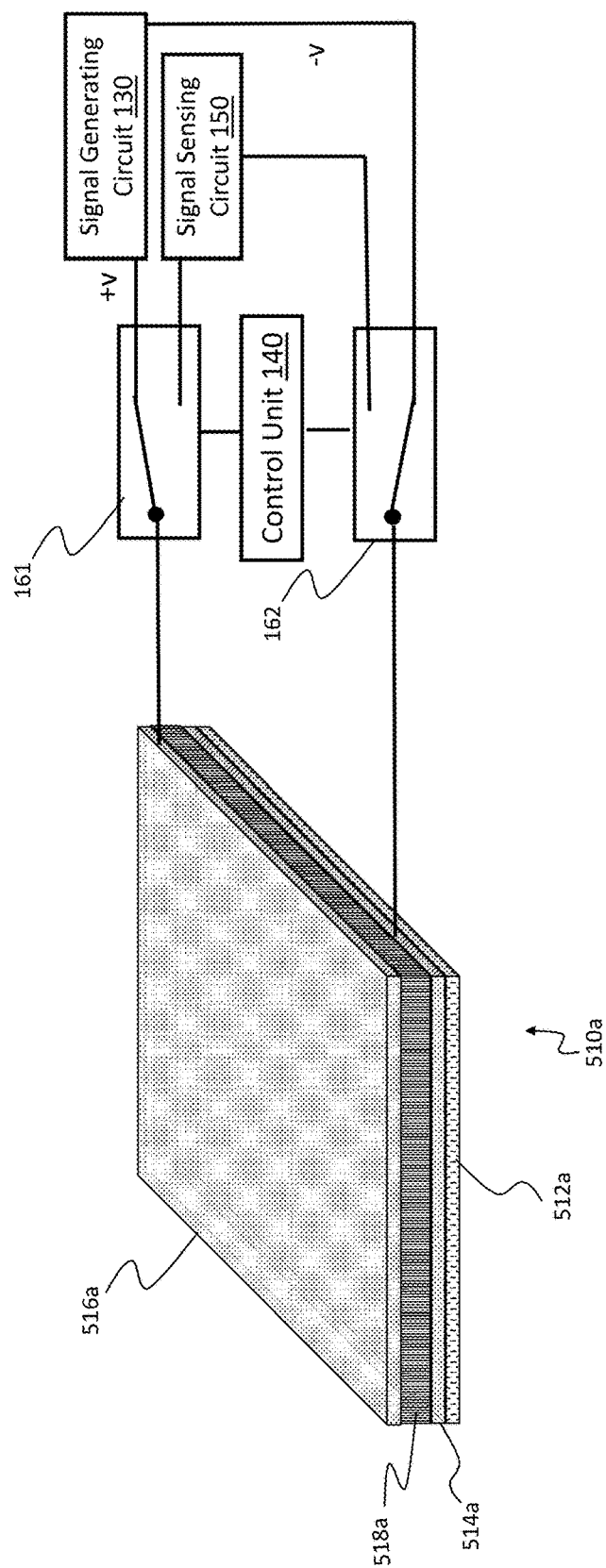
FIGS. 7A-7D illustrate various configurations of one or more switches, a signal generating circuit, and a signal sensing circuit, according to embodiments hereof.

In an embodiment, the piezoelectric material of the piezoelectric layer 518a may be configured to vibrate when a drive signal creates a voltage difference across the piezoelectric layer 518a. For instance, FIG. 7A illustrates an example in which the control unit 140 discussed above is in an actuation mode, and uses the switches 161, 162 to electrically connect the signal generating circuit 130 to the electrodes 516a, 514a of the stack 510a, and electrically disconnect the signal generating circuit 150 from the electrodes 516a, 514a. The drive signal may be applied in a differential mode to create a voltage difference between electrodes 516a, 514a, and thus a voltage difference across opposite ends of the piezoelectric layer 518*a*. In an embodiment, the drive signal has an amplitude that is in a range of 1 V to 50 V.

In the sensing mode, the control unit 140 of FIG. 7A may be configured to electrically disconnect the signal generating circuit 130 from the electrodes 516*a*, 514*a*, and to electrically the signal generating circuit 150 to the electrodes 516*a*, 514*a*. In such an embodiment, a pressure-based touch input may deform the piezoelectric material of the piezoelectric layer 518*a*. The piezoelectric material of the piezoelectric layer 518*a* may not be deformable enough to act as a suspension, but may, in this embodiment, be deformable enough to sense a pressure-based touch input. When the piezoelectric material is deformed, it may generate an electrical signal, which is transferred to electrode 516*a* and/or 514*a*. The signal sensing circuit 150 may sense the signal. If the signal has an amplitude that is at least a defined threshold, the control unit 140 may determine that a pressure-based touch input has been received.

Figure 7B:
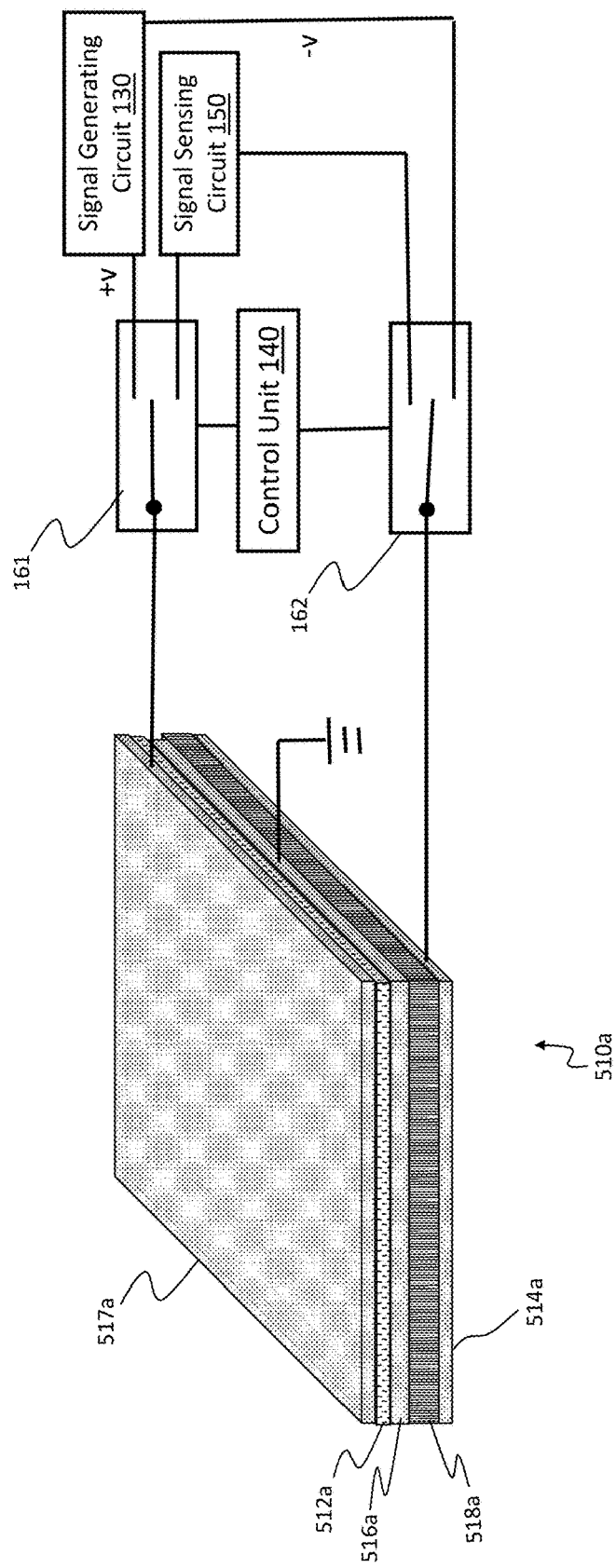

FIG. 7B illustrates an embodiment that includes the third electrode 517*a*. In this embodiment, the electrode 516*a*, which is in electrical contact with both the piezoelectric layer 518*a* and with the elastomeric layer 512*a*, may be used as a common voltage reference, such as a ground potential. In this example, the control unit 140 may be configured, in the sensing mode, to control the switch 162 to electrically connect the signal generating circuit 130 to the electrode 514*a*, and to disconnect the signal sensing circuit 150 from the electrode 514*a*. Further, the embodiment in FIG. 7B may further include a switch 161 to electrically connect one of the signal generating circuit 130 and the signal sensing circuit 150 to the third electrode 517*a*, and to electrically disconnect the other of the signal generating circuit 130 and the signal sensing circuit 150 from the third electrode 517*a*.

Figure 7C:
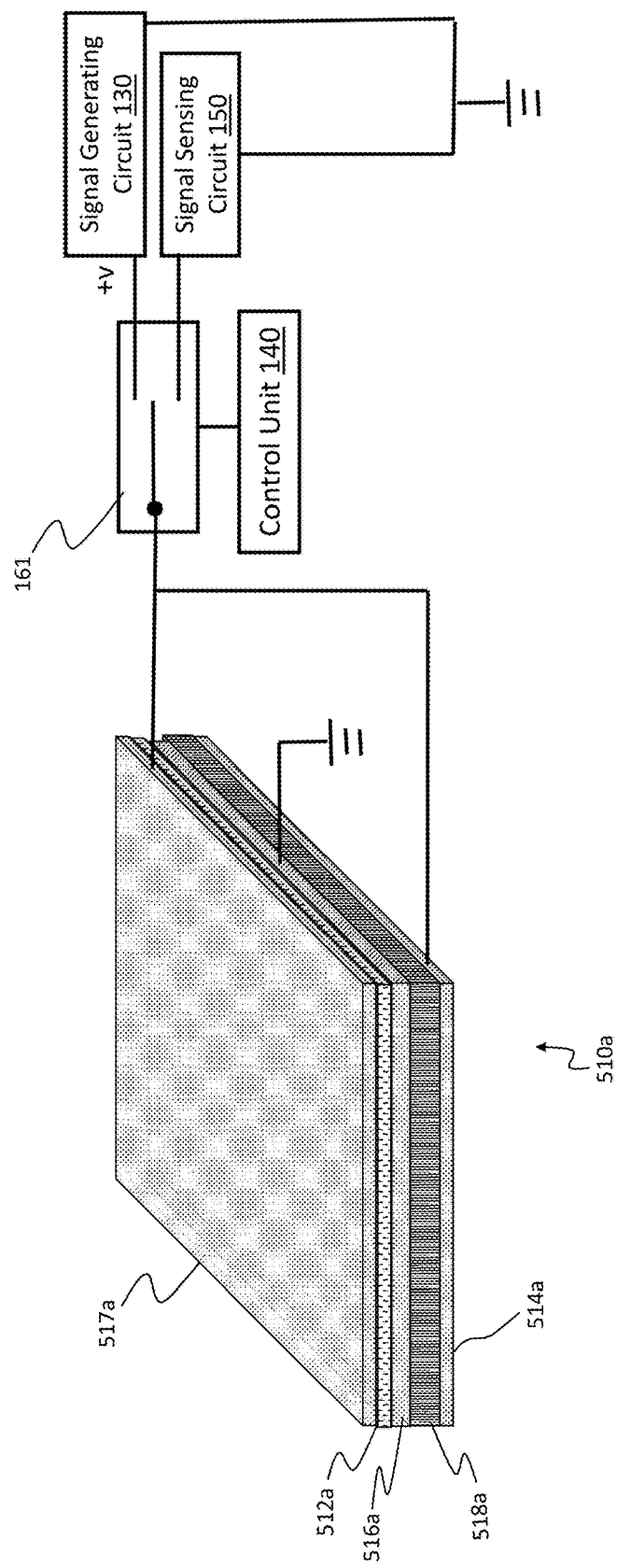
Figure 7D:
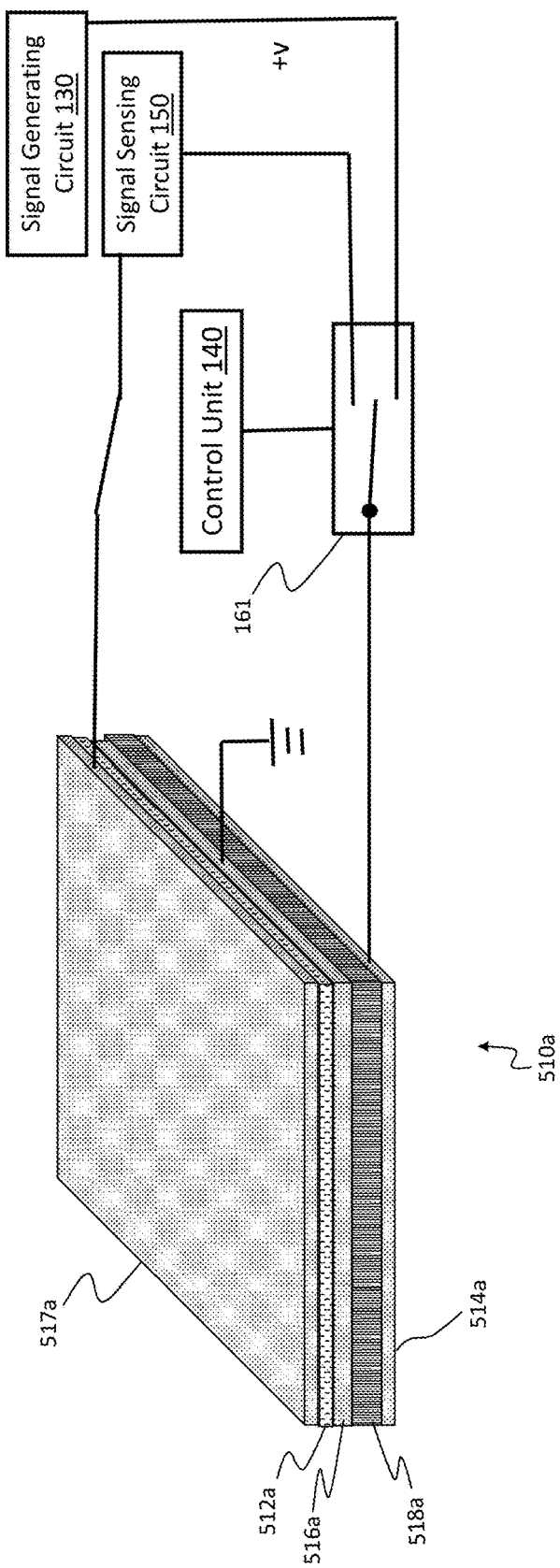

In an embodiment, switch 162 may be omitted. For instance, FIG. 7C illustrates an embodiment that uses only a single switch 161 to electrically connect one of the signal generating circuit 130 or the signal sensing circuit 150 to both electrodes 514*a* and 517*a*, and to electrically disconnect the other of the signal generating circuit 130 or the signal sensing circuit 150 from both electrodes 514*a* and 517*a*. FIG. 7D illustrates another embodiment in which the signal generating circuit 130 drives only the piezoelectric layer 518*a*, rather than the elastomeric layer 512*a*. Such an embodiment may include a single switch 161 that is configured to electrically connect one of the signal generating circuit 130 or signal sensing circuit 150 to the electrode 514*a*, and to disconnect the other of the signal generating circuit 130 or signal sensing circuit 150 from the electrode 514*a*. In this embodiment, the electrode 517*a* is not electrically connected to the signal generating circuit 130, but may be electrically connected to the signal sensing circuit 150.

While various embodiments have been described above, it should be understood that they have been presented only as illustrations and examples of the present invention, and not by way of limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the appended claims and their equivalents. It will also be understood that each feature of each embodiment discussed herein, and of each reference cited herein, can be used in combination with the features of any other embodiment.

What is claimed is:

1. A haptic-enabled user interface device, comprising:
 a user input component;
 a base for supporting the user input component;
 an elastomer suspension for suspending the user input component on the base, such that the user input component does not directly contact the base, wherein the elastomer suspension is formed by at least one stack that includes an elastomeric layer of an elastomer material and includes a pair of electrodes on opposite sides of the elastomeric layer, wherein the at least one stack forms at least one capacitor;
 a signal generating circuit;
 a signal sensing circuit;
 one or more switches configured to electrically connect and to disconnect the signal sensing circuit and the signal generating circuit from the at least one capacitor; and
 a control unit in communication with the signal generating circuit, the signal sensing circuit, and the one or more switches, wherein the control unit is configured,
  in an actuation mode, to cause the one or more switches to electrically connect the signal generating circuit to the at least one capacitor and to electrically disconnect the signal sensing circuit from at least one capacitor, and to cause the signal generating circuit to apply a first signal as a drive signal to the at least one capacitor, wherein the drive signal causes relative movement of the pair of electrodes toward each other so as to generate a haptic effect, and
  in a sensing mode, to cause the one or more switches to electrically connect the signal sensing circuit to the at least one capacitor, and to determine, based on a second signal sensed by the signal sensing circuit, whether a touch input has been received by the user input component of the haptic-enabled user interface device.

2. The haptic-enabled user interface device of claim 1, wherein the control unit is configured, in the sensing mode, to determine whether the touch input has been received by determining, based on the second signal sensed by the signal sensing circuit, whether a capacitance of the at least one capacitor has changed from a defined or measured baseline capacitance by at least a defined threshold.

3. The haptic-enabled user interface device of claim 2, wherein the control unit is configured, in the sensing mode, to cause the one or more switches to electrically disconnect the signal generating circuit from the at least one capacitor.

4. The haptic-enabled user interface device of claim 3, wherein the control unit is configured, in the actuation mode, to electrically disconnect the signal sensing circuit from both electrodes of the pair of electrodes of the at least one capacitor, and is further configured, in the sensing mode, to electrically disconnect the signal generating circuit from both electrodes of the pair of electrodes of the at least one capacitor.

5. The haptic-enabled user interface device of claim 2, wherein the control unit is configured to determine that a pressure-based touch input has been received at the user input component in response to a determination that there is a change in capacitance of the at least one capacitor.

6. The haptic-enabled user interface device of claim 5, wherein the control unit is configured to determine that non-contact proximity of an object to the user input component of the haptic-enabled user interface device has been detected in response to detecting the change in capacitance of the at least one capacitor, wherein the pressure-based touch input is associated with the change in capacitance being in a first defined range relative to a measured or defined baseline capacitance, and wherein the non-contact proximity of an object is associated with the change in capacitance being in a second defined range relative to the measured or defined baseline capacitance.

7. The haptic-enabled user interface device of claim 1, wherein the drive signal has an amplitude in a range of 500 V to 10 kV, and a frequency that is in a range of 10 Hz to 500 Hz.

8. The haptic-enabled user interface device of claim 1, wherein the elastomer material is a polymer having a durometer that is in a range of shore 00-10 to shore A-50, and wherein each of the pair of electrodes is formed from a stretchable conductive material.

9. The haptic-enabled user interface device of claim 8, wherein the elastomer material of the elastomeric layer includes at least one of polyisoprene, isobutylene, isoprene, polybutadiene, styrene-butadiene rubber, ethylene propylene rubber, polyacrylic rubber, or silicone rubber, and wherein the stretchable conductive material includes graphene.

10. The haptic-enabled user interface device of claim 1, wherein the user input component is a button.

11. The haptic-enabled user interface device of claim 1, wherein the haptic-enabled user interface device is a wearable device.

12. The haptic-enabled use interface device of claim 1, wherein the at least one capacitor of the elastomer suspension comprises a plurality of stacks that form a plurality of respective capacitors, and wherein the signal sensing circuit is configured to receive respective signals from the plurality of capacitors, and is configured to determine location-based information for the touch input on a surface of the user input component based on the respective signals.

13. The haptic-enabled user interface device of claim 1, wherein the at least one stack has a thickness that is in a range between 0.2 mm and 10 mm.

14. The haptic-enabled user interface device of claim 1, wherein the elastomer suspension has a resonance frequency that is less than 500 Hz.

15. The haptic-enabled user interface device of claim 1, wherein the elastomer suspension forms a seal between the user input component and the base.

16. The haptic-enabled user interface device of claim 1, wherein the elastomer suspension further includes a piezoelectric layer of ceramic piezoelectric material in contact with at least one electrode of the pair of electrodes, and wherein the drive signal causes the piezoelectric layer to vibrate.

17. A haptic-enabled user interface device, comprising:
a user input component;
a base for supporting the user input component;
an elastomer suspension for suspending the user input component on the base, such that the user input component does not directly contact the base, wherein the elastomer suspension is formed by at least one stack that includes a piezoelectric layer of piezoelectric material, a pair of electrodes on opposite sides of the piezoelectric material, and an elastomeric layer of elastomer material in contact with at least one of the pair of electrodes;
a signal generating circuit;
a signal sensing circuit;
one or more switches configured to electrically connect and disconnect the signal sensing circuit and the signal generating circuit from at least a first electrode or a second electrode of the pair of electrodes; and
a control unit in communication with the signal generating circuit, the signal sensing circuit, and the one or more switches, wherein the control unit is configured,
in an actuation mode, to cause the one or more switches to electrically connect the signal generating circuit to at least one of the first electrode or the second electrode, to cause the one or more switches to electrically disconnect the signal sensing circuit from the at least one of the first electrode or the second electrode, and to cause the signal generating circuit to generate a first signal as a drive signal that causes the piezoelectric layer to vibrate,
in a sensing mode, to cause the one or more switches to electrically connect the signal sensing circuit to the at least one of the first electrode or the second electrode, and to determine, based on a second signal sensed by the signal sensing circuit, whether a user input has been received by the haptic-enabled user interface device, wherein the second signal is caused by deformation of the piezoelectric layer.

18. The haptic-enabled user interface device of claim 17, wherein the control unit is configured, in the actuation mode, to cause the one or more switches to electrically disconnect the signal sensing circuit from both the first electrode and the second electrode, and is configured, in the sensing mode, to electrically disconnect the signal generating circuit from both the first electrode and the second electrode.

19. The haptic-enabled user interface device of claim 17, further comprising a third electrode, wherein the elastomeric layer is disposed between the second electrode and the third electrode,
wherein the control unit is configured, in the actuation mode, to cause the one or more switches to electrically connect the signal generating circuit to both the first electrode and the third electrode, and to electrically disconnect the signal sensing circuit from both the first electrode and the third electrode,
wherein the control unit is configured, in the sensing mode, to cause the one or more switches to electrically connect the signal sensing circuit to both the first electrode and the third electrode, and to electrically disconnect the signal generating circuit from both the first electrode and the third electrode, and
wherein the second electrode is electrically grounded.

20. The haptic-enabled user interface device of claim 17, wherein the ceramic piezoelectric material has a Young's Modulus that is in a range of 100 GPa to 300 GPa, wherein the drive signal has an amplitude in a range of 1 V to 50 V, and the elastomer material is a polymer that has a Young's Modulus that is in a range of 10 MPa to 100 MPa.

* * * * *